US012189293B2

(12) United States Patent
Hsieh et al.

(10) Patent No.: US 12,189,293 B2
(45) Date of Patent: Jan. 7, 2025

(54) METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: Chieh-Hsin Hsieh, Hsinchu (TW); Wei-Han Lai, New Taipei (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 136 days.

(21) Appl. No.: 17/460,152

(22) Filed: Aug. 27, 2021

(65) Prior Publication Data

US 2023/0063073 A1    Mar. 2, 2023

(51) Int. Cl.
G03F 7/09       (2006.01)
G03F 7/004      (2006.01)
G03F 7/105      (2006.01)
H01L 21/027     (2006.01)

(52) U.S. Cl.
CPC ............ G03F 7/094 (2013.01); G03F 7/0045 (2013.01); G03F 7/091 (2013.01); G03F 7/105 (2013.01); H01L 21/0276 (2013.01)

(58) Field of Classification Search
CPC .......... G03F 7/094; G03F 7/105; G03F 7/091; G03F 7/0045; H01L 21/32139; H01L 29/00; H01L 21/31144; H01L 21/0276
See application file for complete search history.

(56) References Cited

U.S. PATENT DOCUMENTS

| 8,796,666 | B1 | 8/2014 | Huang et al. |
| 8,864,894 | B2 * | 10/2014 | Shibayama ............ C09D 5/006 |
| | | | 106/287.15 |
| 9,093,530 | B2 | 7/2015 | Huang et al. |
| 9,213,234 | B2 | 12/2015 | Chang |
| 9,223,220 | B2 | 12/2015 | Chang |
| 9,256,133 | B2 | 2/2016 | Chang |
| 9,536,759 | B2 | 1/2017 | Yang et al. |
| 9,548,303 | B2 | 1/2017 | Lee et al. |
| 9,857,684 | B2 | 1/2018 | Lin et al. |
| 9,859,206 | B2 | 1/2018 | Yu et al. |
| 9,875,892 | B2 | 1/2018 | Chang et al. |
| 2016/0231652 | A1 * | 8/2016 | Hatakeyama ......... G03F 7/2059 |
| 2018/0364571 | A1 * | 12/2018 | Nishio .................... G03F 7/039 |
| 2020/0073243 | A1 * | 3/2020 | Ho .......................... G03F 7/322 |

FOREIGN PATENT DOCUMENTS

JP        2018189758 A2 *   11/2018   ............. G03F 7/004

OTHER PUBLICATIONS

Translated Description of Tsuchimura (Year: 2018).*

* cited by examiner

*Primary Examiner* — Sean M DeGuire
*Assistant Examiner* — Andrew Preston Traywick
(74) *Attorney, Agent, or Firm* — STUDEBAKER & BRACKETT PC

(57) ABSTRACT

A method of manufacturing a semiconductor device includes forming a first layer including an organic material over a substrate. A second layer including a reaction product of a silicon-containing material and a photoacid generator is formed over the first layer. A photosensitive layer is formed over the second layer, and the second layer is patterned.

20 Claims, 28 Drawing Sheets

| 235 | 235 | 235 | 235 | 235 | 235 |
|---|---|---|---|---|---|
| 230 | 230 | 230 | 230 | 230 | 230 |
| 210 | 210 | 210 | 210 | 210 | 210 |
| N1 | N2 | N3 | P3 | P2 | P1 |

Fig. 19A

| 245 | 245 | 245 | 245 | 245 | 245 |
|---|---|---|---|---|---|
| 235 | 235 | 235 | 235 | 235 | 235 |
| 230 | 230 | 230 | 230 | 230 | 230 |
| 210 | 210 | 210 | 210 | 210 | 210 |
| N1 | N2 | N3 | P3 | P2 | P1 |

Fig. 19B

| 200 | 200 | 200 | 200 | 200 | 200 |
|---|---|---|---|---|---|
| 245 | 245 | 245 | 245 | 245 | 245 |
| 235 | 235 | 235 | 235 | 235 | 235 |
| 230 | 230 | 230 | 230 | 230 | 230 |
| 210 | 210 | 210 | 210 | 210 | 210 |
| N1 | N2 | N3 | P3 | P2 | P1 |

Fig. 19C

| 205 | 205 | 205 | 205 | 205 | 205 |
|---|---|---|---|---|---|
| 300 | 300 | 300 | 300 | 300 | 300 |
| 260 | 260 | 260 | 260 | 260 | 260 |
| 200 | 200 | 200 | 200 | 200 | 200 |
| 245 | 245 | 245 | 245 | 245 | 245 |
| 235 | 235 | 235 | 235 | 235 | 235 |
| 230 | 230 | 230 | 230 | 230 | 230 |
| 210 | 210 | 210 | 210 | 210 | 210 |
| N1 | N2 | N3 | P3 | P2 | P1 |

Fig. 19D

| 205 | 205 | 205 | | | |
|---|---|---|---|---|---|
| 300 | 300 | 300 | | | |
| 260 | 260 | 260 | | | |
| 200 | 200 | 200 | 200 | 200 | 200 |
| 245 | 245 | 245 | 245 | 245 | 245 |
| 235 | 235 | 235 | 235 | 235 | 235 |
| 230 | 230 | 230 | 230 | 230 | 230 |
| 220 | 220 | 220 | 220 | 220 | 220 |
| N1 | N2 | N3 | P3 | P2 | P1 |

Fig. 19E

| 205 | 205 | 205 | | | |
|---|---|---|---|---|---|
| 300 | 300 | 300 | | | |
| 260 | 260 | 260 | | | |
| 200 | 200 | 200 | | | |
| 245 | 245 | 245 | 245 | 245 | 245 |
| 235 | 235 | 235 | 235 | 235 | 235 |
| 230 | 230 | 230 | 230 | 230 | 230 |
| 220 | 220 | 220 | 220 | 220 | 220 |
| N1 | N2 | N3 | P3 | P2 | P1 |

Fig. 19F

| 200 | 200 | 200 | | | |
|---|---|---|---|---|---|
| 245 | 245 | 245 | 245 | 245 | 245 |
| 235 | 235 | 235 | 235 | 235 | 235 |
| 230 | 230 | 230 | 230 | 230 | 230 |
| 220 | 220 | 220 | 220 | 220 | 220 |
| N1 | N2 | N3 | P3 | P2 | P1 |

Fig. 19G

| 250 | 250 | 250 | | | |
|---|---|---|---|---|---|
| 200 | 200 | 200 | | | |
| | | | 250 | 250 | 250 |
| 245 | 245 | 245 | 245 | 245 | 245 |
| 235 | 235 | 235 | 235 | 235 | 235 |
| 230 | 230 | 230 | 230 | 230 | 230 |
| 220 | 220 | 220 | 220 | 220 | 220 |
| N1 | N2 | N3 | P3 | P2 | P1 |

Fig. 19H

| 280 | 280 | 280 | | | |
|---|---|---|---|---|---|
| 250 | 250 | 250 | | | |
| 200 | 200 | 200 | 280 | 280 | 280 |
| | | | 250 | 250 | 250 |
| 245 | 245 | 245 | 245 | 245 | 245 |
| 235 | 235 | 235 | 235 | 235 | 235 |
| 230 | 230 | 230 | 230 | 230 | 230 |
| 210 | 210 | 210 | 210 | 210 | 210 |
| N1 | N2 | N3 | P3 | P2 | P1 |

Fig. 19I

| 215 | 215 | 215 | | | |
|---|---|---|---|---|---|
| 305 | 305 | 305 | | | |
| 265 | 265 | 265 | 215 | 215 | 215 |
| | | | 305 | 305 | 305 |
| | | | 265 | 265 | 265 |
| 280 | 280 | 280 | | | |
| 250 | 250 | 250 | | | |
| 200 | 200 | 200 | 280 | 280 | 280 |
| | | | 250 | 250 | 250 |
| 245 | 245 | 245 | 245 | 245 | 245 |
| 235 | 235 | 235 | 235 | 235 | 235 |
| 230 | 230 | 230 | 230 | 230 | 230 |
| 210 | 210 | 210 | 210 | 210 | 210 |
| N1 | N2 | N3 | P3 | P2 | P1 |

| N1 | N2 | N3 | P3 | P2 | P1 |
|---|---|---|---|---|---|
| | | 225 | | | |
| 225 | 225 | 310 | | | 225 |
| 310 | 310 | 270 | 225 | 225 | 310 |
| 270 | 270 | | 310 | 310 | 270 |
| | | 285 | 270 | 270 | |
| 285 | 285 | 280 | | | 285 |
| 250 | 250 | 250 | | | 280 |
| 200 | 200 | 200 | 285 | 285 | 250 |
| | | | 250 | 250 | |
| 245 | 245 | 245 | 245 | 245 | 245 |
| 235 | 235 | 235 | 235 | 235 | 235 |
| 230 | 230 | 230 | 230 | 230 | 230 |
| 210 | 210 | 210 | 210 | 210 | 210 |

Fig. 19P

| N1 | N2 | N3 | P3 | P2 | P1 |
|---|---|---|---|---|---|
| | | 225 | | | |
| | 225 | 310 | | | 225 |
| | 310 | 270 | | 225 | 310 |
| | 270 | | | 310 | 270 |
| | | 285 | | 270 | |
| 285 | 285 | 280 | | | 285 |
| 250 | 250 | 250 | | | 280 |
| 200 | 200 | 200 | 285 | 285 | 250 |
| | | | 250 | 250 | |
| 245 | 245 | 245 | 245 | 245 | 245 |
| 235 | 235 | 235 | 235 | 235 | 235 |
| 230 | 230 | 230 | 230 | 230 | 230 |
| 210 | 210 | 210 | 210 | 210 | 210 |

Fig. 19Q

| N1 | N2 | N3 | P3 | P2 | P1 |
|---|---|---|---|---|---|
|  |  | 225 |  |  |  |
|  | 225 | 310 |  |  | 225 |
|  | 310 |  |  | 225 | 310 |
|  | 270 | 270 |  | 310 | 270 |
|  |  | 285 |  | 270 |  |
|  | 285 | 280 |  |  | 285 |
| 250 | 250 | 250 |  |  | 280 |
| 200 | 200 | 200 |  | 285 |  |
|  |  |  | 250 | 250 | 250 |
| 245 | 245 | 245 | 245 | 245 | 245 |
| 235 | 235 | 235 | 235 | 235 | 235 |
| 230 | 230 | 230 | 230 | 230 | 230 |
| 210 | 210 | 210 | 210 | 210 | 210 |

Fig. 19R

| N1 | N2 | N3 | P3 | P2 | P1 |
|---|---|---|---|---|---|
|  |  | 285 |  |  |  |
|  | 285 | 280 |  |  |  |
| 250 | 250 | 250 |  |  | 285 |
| 200 | 200 | 200 |  | 285 | 280 |
|  |  |  | 250 | 250 | 250 |
| 245 | 245 | 245 | 245 | 245 | 245 |
| 235 | 235 | 235 | 235 | 235 | 235 |
| 230 | 230 | 230 | 230 | 230 | 230 |
| 210 | 210 | 210 | 210 | 210 | 210 |

METHOD OF MANUFACTURING A SEMICONDUCTOR DEVICE

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 19A, 19B, 19C, 19D, 19E, 19F, 19G, 19H, 19I, 19J, 19K, 19L, 19M, 19N, 19O, 19P, 19Q, and 19R show a sequential operation according to embodiments of the disclosure.

DETAILED DESCRIPTION

Figure 1:
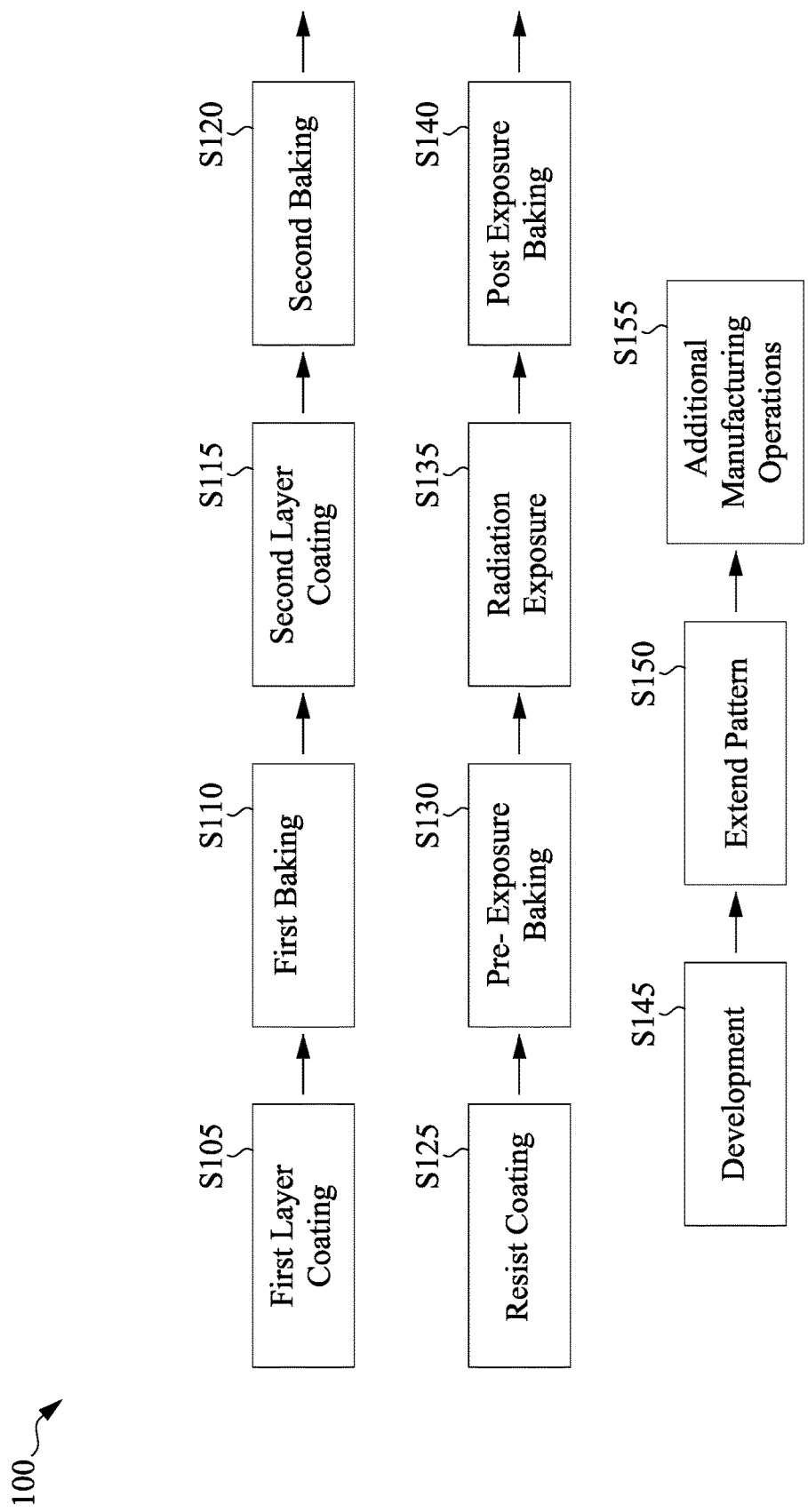
FIG. 1 illustrates a process flow of manufacturing a semiconductor device according to embodiments of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

As semiconductor device pattern features become smaller, photoresist pattern resolution becomes more important. Extreme ultraviolet (EUV) lithography technology is used as pattern sizes become smaller due to better resolution than immersion ArF lithography. However, scum defects may be formed during EUV lithography because of weak absorption of the photoresist by 13.5 nm radiation. Undeveloped resist remaining in trenches could lead to bridging lines or footing, resulting in failure of transferring the photoresist pattern to underlying layers.

Trilayer resists are used to provide increased pattern resolution and etching electivity. Trilayer resists include a bottom layer, middle layer, and an upper, photosensitive layer. A high Si content middle layer provides good adhesion, low reflectivity, and a high degree of etching selectivity to both the photosensitive upper layer and the bottom layer. In some embodiments, middle layer monomers cross-link when heated, and terminal hydroxyl groups react with Si—O bonds to form high molecular weight polymers. The bottom layer, such as a bottom anti-reflective coating (BARC) or spin on carbon (SOC) coating, is used to planarize the device or protect semiconductor device features, such as the metal gates, during subsequent processing operations. Embodiments of the present disclosure include methods and materials that reduce scum defects, thereby improving pattern resolution, decreasing line width roughness, decreasing line edge roughness, and improving semiconductor device yield. Embodiments of the disclosure further enables the use of lower exposure doses to effectively expose and pattern the photoresist.

Embodiments of the disclosure include a polymer bound photoacid generator (PAG) in the middle layer. In some embodiments, the PAG is a cationic onium group. Upon exposure to actinic radiation the PAG generates an acid in the middle layer, and generated acid subsequently diffuses from the middle layer across the middle layer/upper layer interface in the exposure area. The acid diffusing into the upper, photosensitive layer reacts with the resist polymer and reduces the scum defect. In addition, the acid diffusing from the middle layer supplements photogenerated acid in the upper layer, thereby reducing the exposure dose necessary to fully expose the photosensitive layer. Lower required exposure doses increases the number of wafers per hour (WPH) than can be processed during the lithography operation, resulting in higher device yield and increased device manufacturing efficiency.

Figure 2:
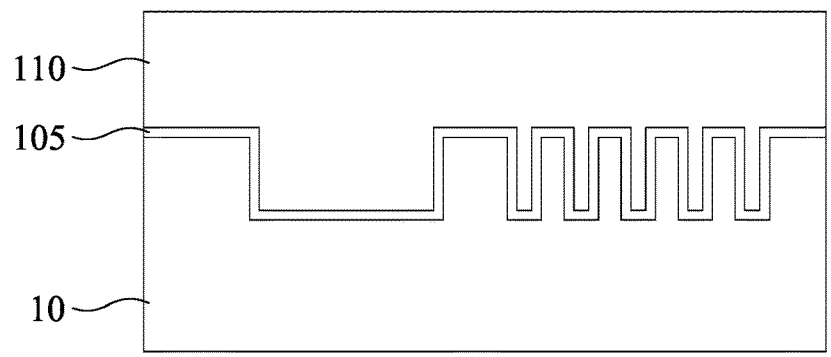
FIG. 2 shows a process stage of a sequential operation according to an embodiment of the disclosure.

FIG. 1 illustrates a process flow 100 of manufacturing a semiconductor device according to embodiments of the disclosure. A first layer (or bottom layer) composition is coated over the surface of a substrate in operation S105 to form a first (or bottom) layer 110, as shown in FIG. 2. In some embodiments, the substrate has device features formed thereon, as shown in FIG. 2. In some embodiments, the bottom layer 110 is a bottom anti-reflection coating (BARC) layer or a planarizing layer. In some embodiments, the bottom layer 110 is a spin-on carbon layer. In some embodiments, the bottom layer 110 has a thickness ranging from about 10 nm to about 2,000 nm. In some embodiments, the thickness of the bottom layer ranges from about 200 nm to about 1,500 nm. Bottom layer thicknesses less than the disclosed ranges may not provide sufficient protection to the semiconductor device features from subsequent processing operations or sufficient planarization. Bottom layer thicknesses greater than the disclosed ranges may be unnecessarily thick and may not provide any additional significant protection of underlying device features or planarization. In some embodiments, the underlying features include transistors having fin structures or gate structures. In some embodiments, the underlying features include a conductive layer 105, such as a metal layer.

The bottom layer 110 undergoes a first baking operation S110 to evaporate solvents or cure the bottom layer composition in some embodiments. In some embodiments, the baking operation S110 crosslinks the bottom layer composition. The bottom layer 110 is baked at a temperature and time sufficient to cure and dry the bottom layer 110. In some embodiments, the bottom layer is heated at a temperature ranging from about 40° C. to about 400° C. for about 10 seconds to about 10 minutes. In other embodiments, the bottom layer 110 is heated at a temperature ranging from about 100° C. to about 400° C. In other embodiments, the bottom layer 110 is heated at a temperature ranging from about 250° C. to about 350° C. In other embodiments, the bottom layer 110 is heated at a temperature ranging from about 200° C. to about 300° C. Heating the bottom layer at temperatures below the disclosed ranges may result in insufficient curing or crosslinking, while heating the bottom layer at temperatures greater than the disclosed ranges may result in damage to the bottom layer and the underlying device features. In some embodiments, the curing operation S110 is performed by exposing the bottom layer to actinic radiation. In some embodiments, the actinic radiation is ultraviolet radiation. In some embodiments, the ultraviolet radiation has a wavelength ranging from about 100 nm to less than about 300 nm.

In some embodiments, capillary force between the bottom layer composition and the substrate 10 or conductive layer 105 enhances the gap filling of the bottom layer composition. Polar groups in polymers in the bottom layer composition may interact with the conductive layer 105 or the substrate 10, which may enhance the gap filling.

Figure 3:
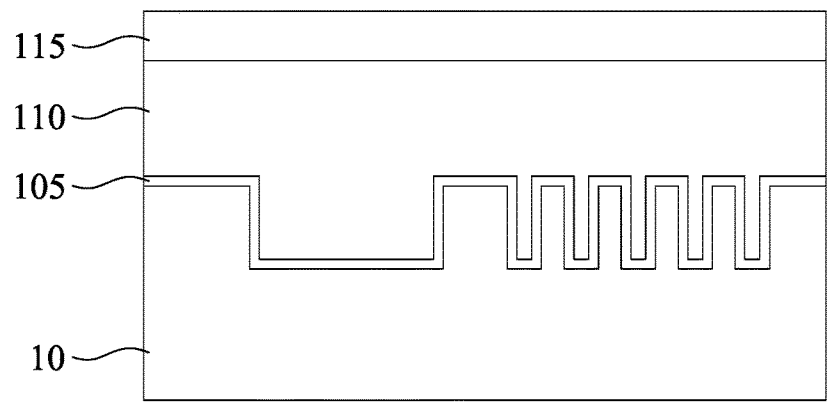
FIG. 3 shows a process stage of a sequential operation according to embodiments of the disclosure.

A second layer (or middle layer) composition is coated over the surface of the bottom layer 110 in operation S115 to form a second (or middle) layer 115, as shown in FIG. 3. The middle layer 115 may have a composition that provides anti-reflective properties for the photolithography operation or hard mask properties. In some embodiments, the middle layer 115 has high etching selectivity relative to both the bottom layer and the upper layer, and the middle layer 115 provides good adhesion to both the bottom layer and the upper layer. In some embodiments, the middle layer 115 includes a silicon-containing layer (e.g., a silicon hard mask material). The middle layer 115 may include a silicon-containing inorganic polymer. In some embodiments, the middle layer composition includes silicon-containing monomers, photoacid generators, silicon-containing monomers with bound photoacid generator groups or combinations thereof.

In some embodiments, the middle layer 115 has a thickness ranging from about 10 nm to about 500 nm. In some embodiments, the thickness of the middle layer 115 ranges from about 20 nm to about 200 nm. In some embodiments, a ratio of the bottom layer thickness to the middle thickness ranges from about 1:1 to about 200:1. Middle layer thicknesses less than the disclosed ranges may not provide sufficient adhesion or etching resistance. Middle layer thicknesses greater than the disclosed ranges may be unnecessarily thick and may not provide any additional significant adhesion or etching resistance.

The middle layer 115 undergoes a second baking operation S120 to evaporate solvents or cure the middle layer composition in some embodiments. In some embodiments, the second baking operation S120 causes a compound having a photoacid generator group and silicon-containing compound to react. In some embodiments, the second baking operation S120 causes a monomer having a photoacid generator group and a silicon-containing monomer to polymerize or crosslink. The middle layer 115 is heated at a temperature ranging from about 150° C. to about 300° C. for about 10 seconds to about 10 minutes. In other embodiments, the middle layer 115 is heated at a temperature ranging from about 200° C. to about 250° C. Heating the middle layer at temperatures below the disclosed ranges may result in insufficient curing or crosslinking, while heating the middle layer at temperatures greater than the disclosed ranges may result in damage to the middle layer and the underlying device features.

Figure 4:
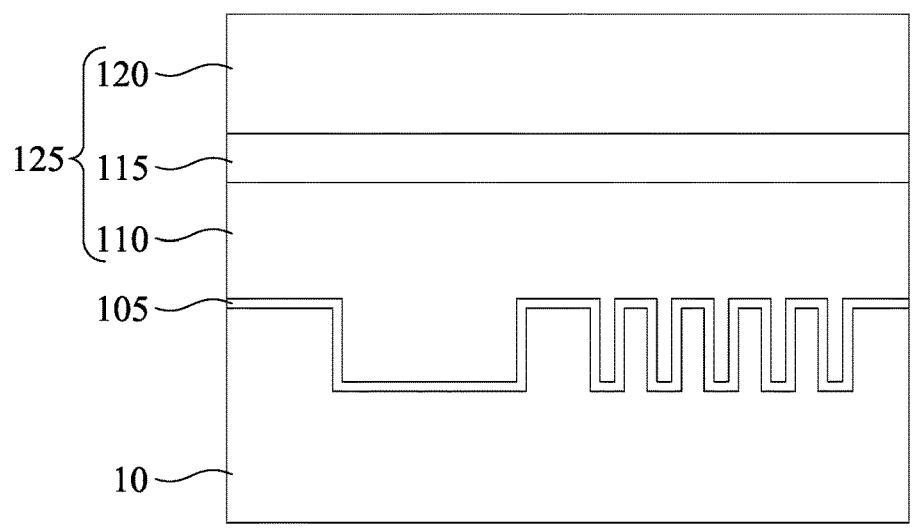
FIG. 4 shows a process stage of a sequential operation according to an embodiment of the disclosure.

A photosensitive upper layer 120 is formed by coating a resist composition over the middle layer 115 in operation S125, as shown in FIG. 4 in some embodiments. In some embodiments, the photosensitive layer 120 is a photoresist layer. Together, the bottom layer 110, middle layer 115, and the photosensitive (or upper) layer 120 make up a trilayer resist 125. Then, the photoresist layer 120 undergoes a third baking operation S130 (or pre-exposure baking) to evaporate solvents in the resist composition in some embodiments. The photosensitive layer 120 is baked at a temperature and time sufficient to cure and dry the photosensitive layer 120. In some embodiments, the photosensitive layer is heated at a temperature of ranging from about 40° C. to about 120° C. for about 10 seconds to about 10 minutes.

After the pre-exposure baking operation S130 of the photoresist layer 120, the photoresist layer 120 and the middle layer 115 are selectively exposed (or patternwise exposed) to actinic radiation 45/97 (see FIGS. 5A and 5B) in operation S135. In some embodiments, the photoresist layer 120 and middle layer are selectively exposed to ultraviolet radiation. In some embodiments, the radiation is electromagnetic radiation, such as g-line (wavelength of about 436 nm), i-line (wavelength of about 365 nm), ultraviolet radiation, deep ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

Figure 5A:
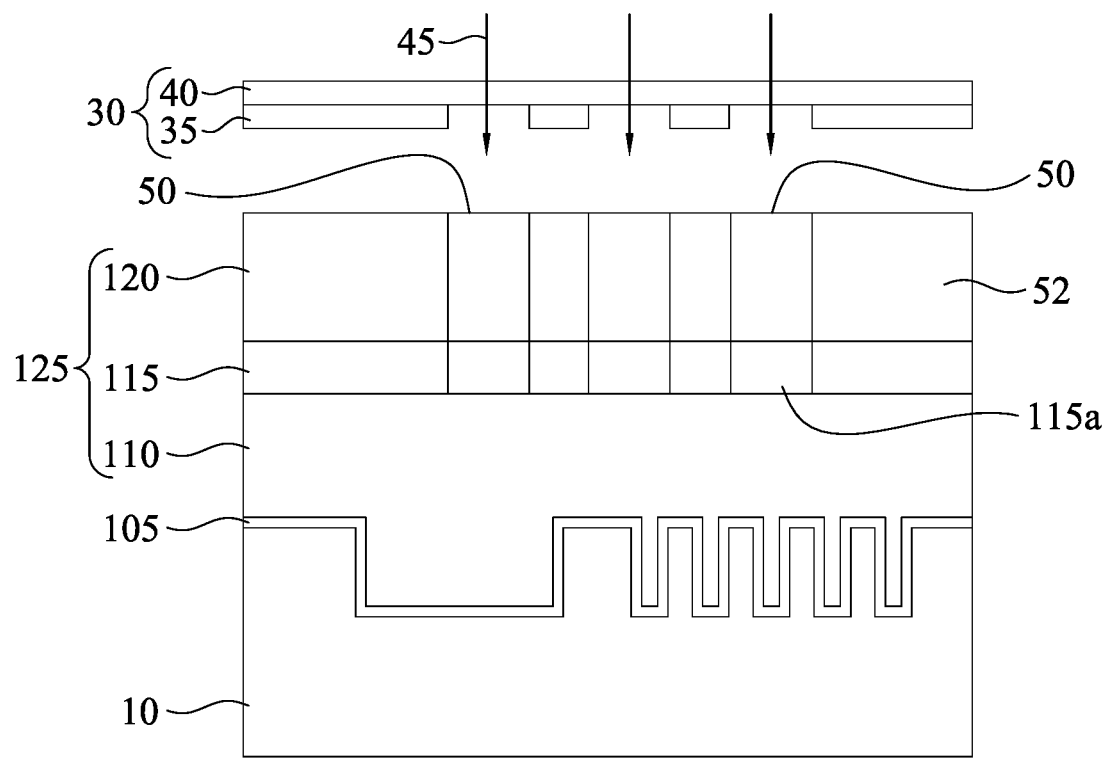
FIGS. 5A and 5B show a process stage of a sequential operation according to an embodiment of the disclosure.

As shown in FIG. 5A, the exposure radiation 45 passes through a photomask 30 before irradiating the photoresist layer 120 and middle layer 115 in some embodiments. In some embodiments, the photomask 30 has a pattern to be replicated in the photoresist layer 120. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 5B:
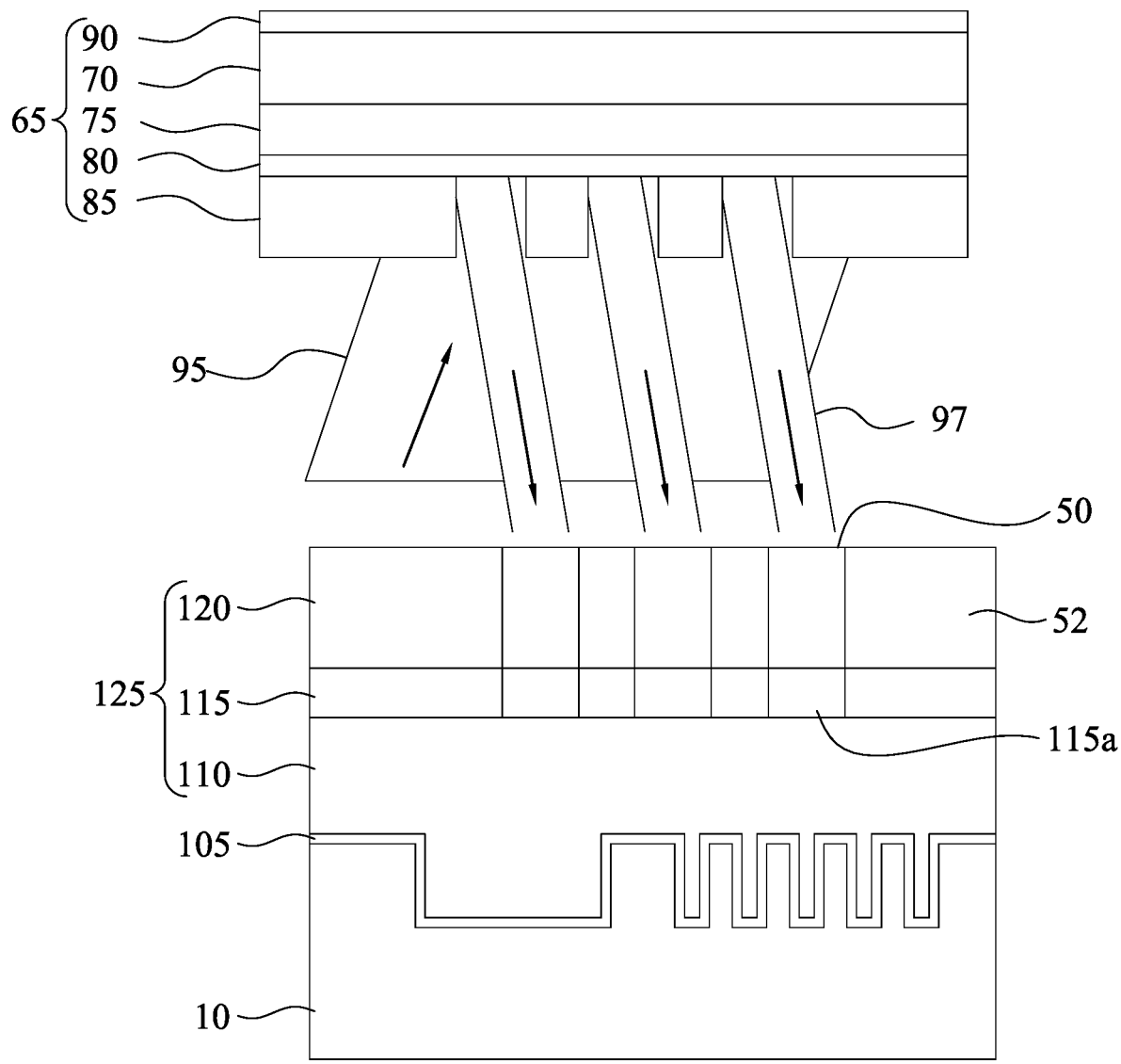

In some embodiments, the selective exposure of the photoresist layer 120 and middle layer 115 to form exposed regions 50, 115a and unexposed regions 52, 115 is performed using extreme ultraviolet lithography. In an extreme ultraviolet lithography operation, a reflective photomask 65 is used to form the patterned exposure light in some embodiments, as shown in FIG. 5B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion glass substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist coated substrate 10, while the portion of the extreme ultraviolet radiation incident upon the absorber layer 85 is absorbed by the photomask. In some embodiments, additional optics, including mirrors, are between the reflective photomask 65 and the photoresist coated substrate.

The region 50 of the photoresist layer exposed to radiation undergoes a chemical reaction thereby changing its solubility in a subsequently applied developer relative to the region 52 of the photoresist layer not exposed to radiation. In some embodiments, the actinic radiation causes a photoacid generator in the portions of the middle layer 115 exposed to radiation to generate an acid. In some embodiments, the actinic radiation causes a photoacid generator in the photoresist layer 120 to generate an acid. In some embodiments, an anion or a cation of a photoacid generator compound in the photoresist layer 120 and is different from an anion or a cation of a photoacid generator in the middle layer 115.

Next, the trilayer resist 125 undergoes a fourth baking (or post-exposure bake (PEB)) in operation S140. In some embodiments, the photosensitive layer 120 and the middle layer 115 are heated at a temperature ranging from about 50° C. to about 160° C. for about 20 seconds to about 120 seconds. The post-exposure baking may be used to assist in the generating, dispersing, and reacting of the acid generated from the impingement of the radiation 45/97 upon the photoresist layer 120 and middle layer 115 during the exposure. The post-exposure baking operation S140 assists acid generated in the middle layer 115a to diffuse from portions 115a of the middle layer exposed to the actinic radiation into the exposed portions 50 of the photoresist layer 120. Such assistance helps to create or enhance chemical reactions, which generate chemical differences between the exposed region 50 and the unexposed region 52 within the photoresist layer, thereby improving the resolution of the subsequently developed pattern and reducing resist scum which may otherwise occurs at the bottom of the photoresist layer 120.

Figure 6:
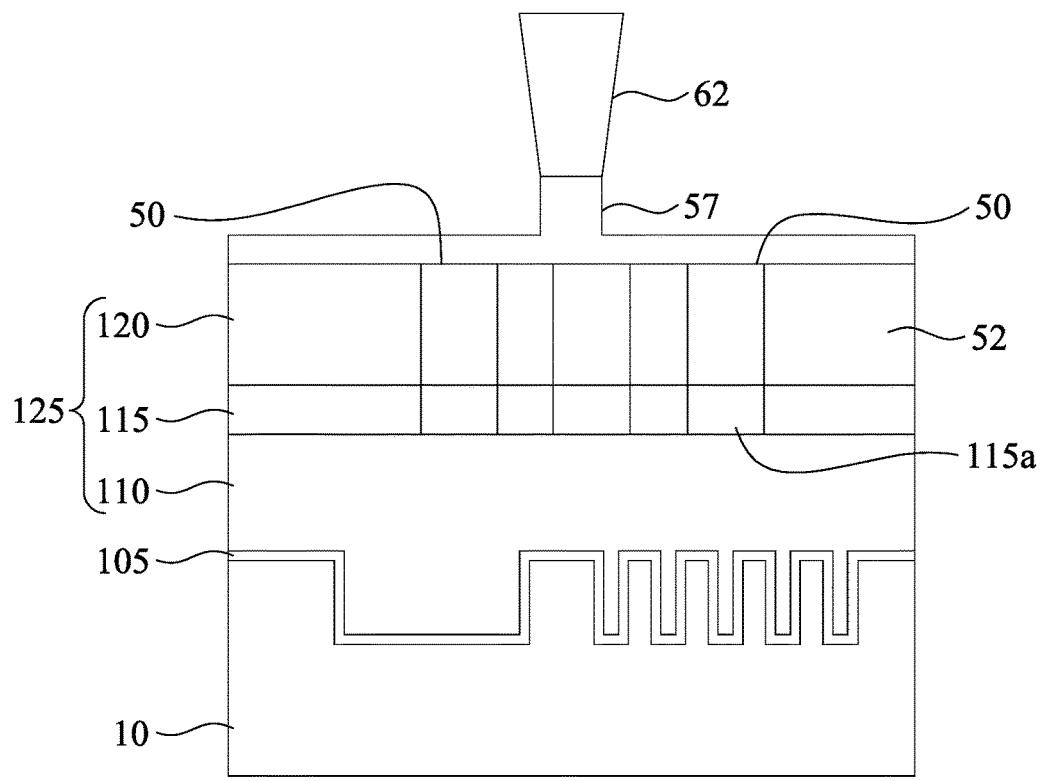
FIG. 6 shows a process stage of a sequential operation according to an embodiment of the disclosure.
Figure 7:
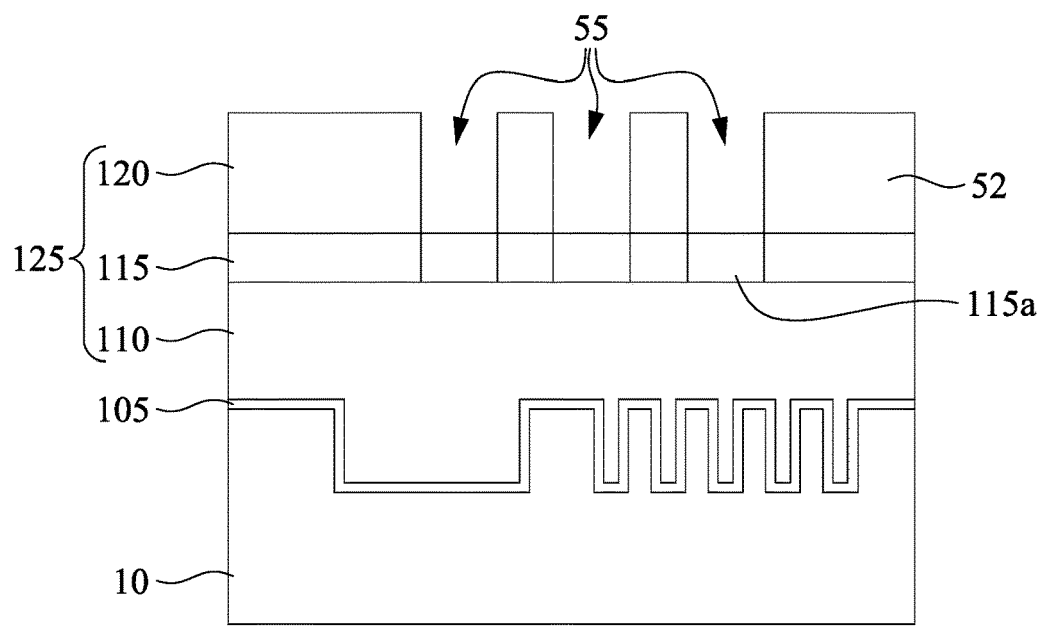
FIG. 7 shows a process stage of a sequential operation according to an embodiment of the disclosure.

The selectively exposed photoresist layer is subsequently developed by applying a developer to the selectively exposed photoresist layer in operation S145. As shown in FIG. 6, a developer 57 is supplied from a dispenser 62 to the selectively exposed photoresist layer 120. In some embodiments, the exposed region 50 of the photoresist layer is removed by the developer 57 forming a pattern of openings 55 in the photoresist layer 120 to expose the middle layer 115a, as shown in FIG. 7.

Figure 8:
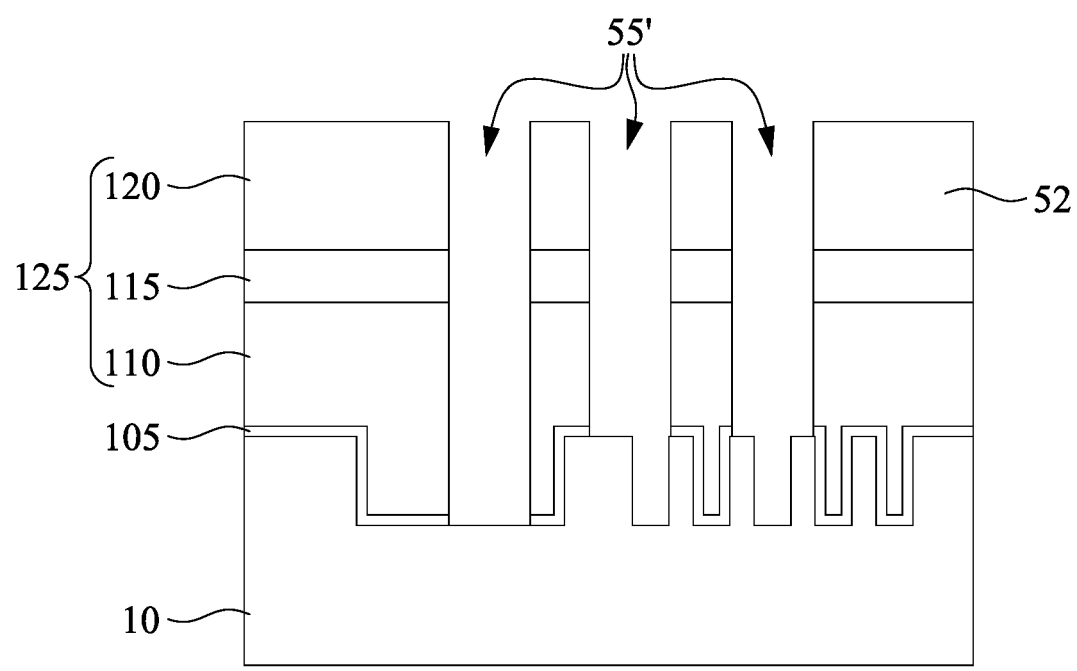
FIG. 8 shows a process stage of a sequential operation according to an embodiment of the disclosure.
Figure 9:
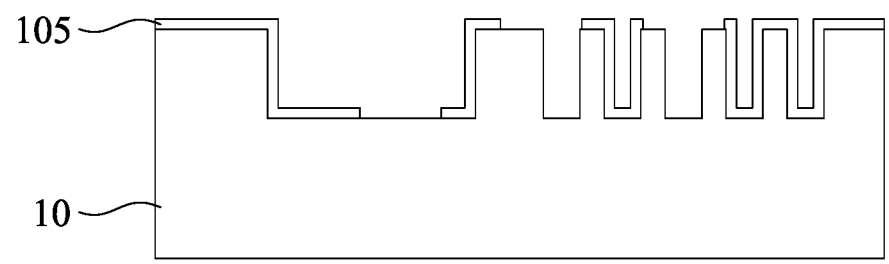
FIG. 9 shows a process stage of sequential operations according to an embodiment of the disclosure.

In some embodiments, the openings or pattern 55 in the photoresist layer are extended through the middle layer 115 and the bottom layer 110 in operation S150 using suitable etchants selective to each respective layer to form an extended opening or pattern 55', as shown in FIG. 8. In some embodiments, an exposed portion of underlying layers, such as the conductive layer 105 in the extended opening or pattern 55' is removed using a suitable etching operation, as shown in FIG. 8. The photoresist layer 120, middle layer 115, and bottom layer 110 are subsequently removed in operation S155 using suitable photoresist stripping, etching, or plasma ashing operations, as shown in FIG. 9. In other embodiments, after the pattern 55 of the photoresist layer 120 is extended to the middle layer 115 to form a patterned middle layer, the photoresist layer 120 is removed, and then by using the patterned middle layer as an etching mask, the bottom layer 110 (and the conductive layer 105) is patterned.

Figure 10A:
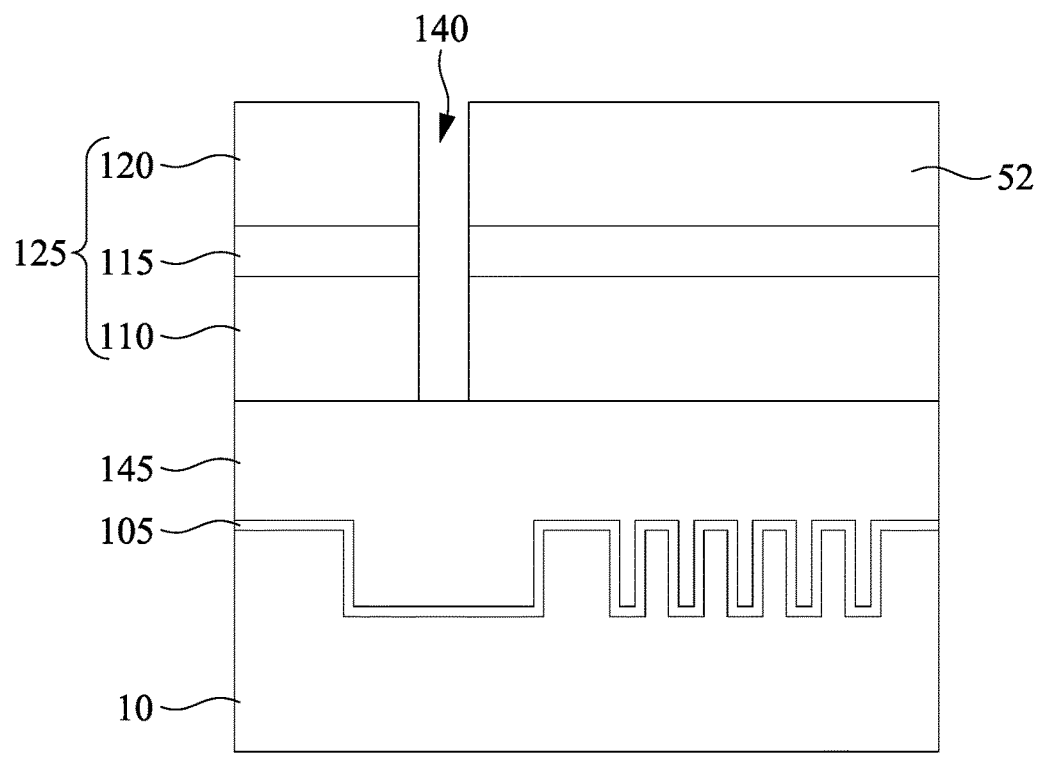
FIGS. 10A, 10B, 10C, and 10D show process stages of sequential operations according to an embodiment of the disclosure.
Figure 10B:
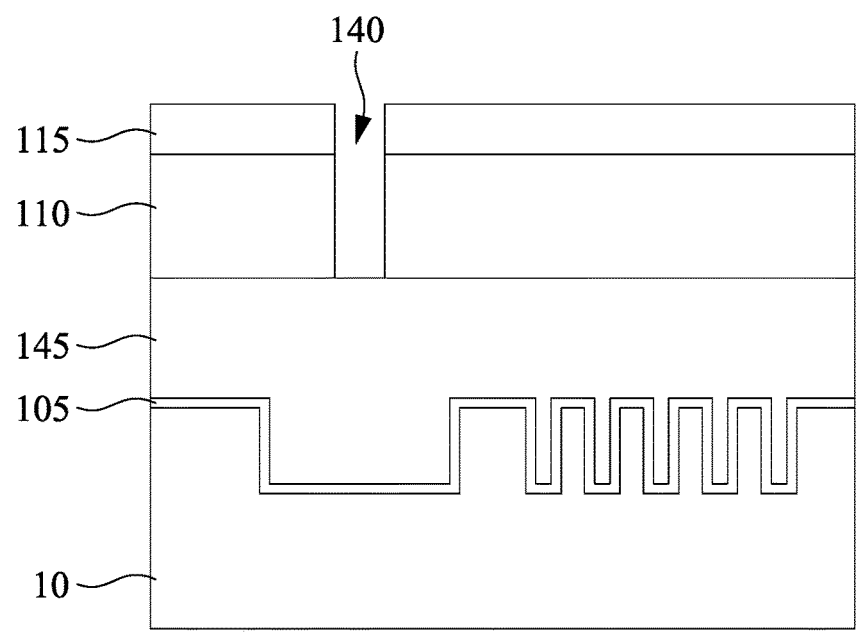
Figure 10C:
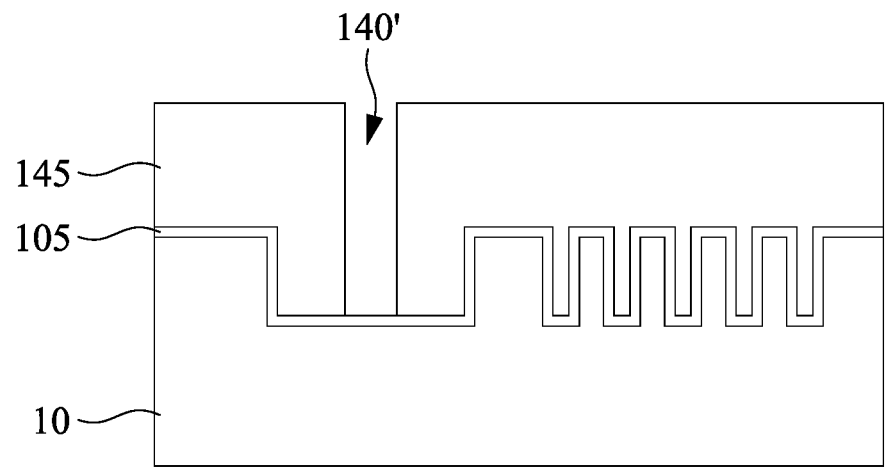
Figure 10D:
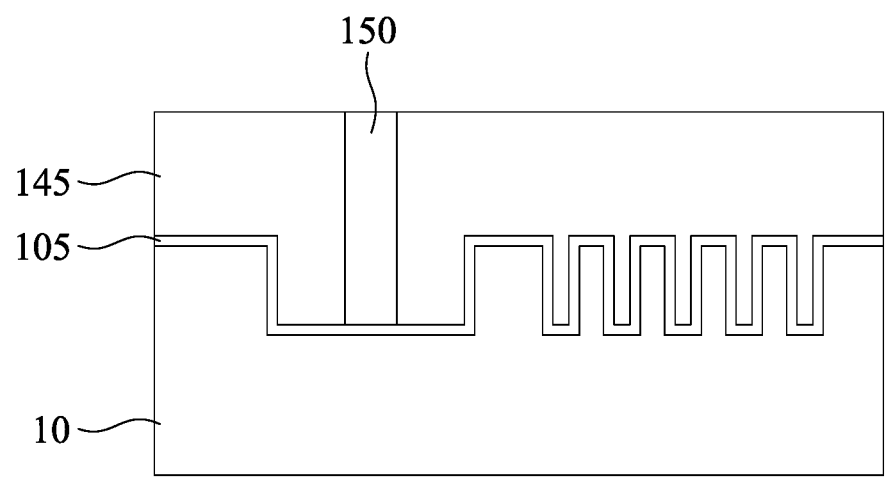

In other embodiments, an interlayer dielectric (ILD) layer 145 is formed over the features disposed over the substrate 10, as shown in FIG. 10A. A trilayer resist 125 is formed, using the materials and operations described herein, over the ILD layer 145, and an opening 140 is formed in the trilayer resist 125. The photoresist layer 120 is removed by a suitable photoresist stripping or plasma ashing operation, as shown in FIG. 10B in some embodiments. Then the middle layer 115 is used as a hard mask to extend the opening 140 into the ILD layer 145 forming a via 140' exposing the conductive layer 105. After forming the via 140', the middle layer and bottom layer are removed by suitable operations, such as etching and plasma ashing, as shown in FIG. 10C. A conductive contact 150 is subsequently formed connected to the conductive layer 105 by filling the via 140' with a conductive material by a suitable deposition technique, as shown in FIG. 10D. In some embodiments, the deposition techniques include chemical vapor deposition (CVD), physical vapor deposition (PVD), or atomic layer deposition (ALD) techniques. In some embodiments, the conductive contact 150 is formed of one or more metals selected from tungsten, copper, nickel, titanium, tantalum, aluminum, and alloys thereof. In some embodiments, a planarizing operation, such as chemical-mechanical polishing or an etch back operation is performed to remove metal deposited over the upper surface of the ILD layer 145.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

Figure 11:
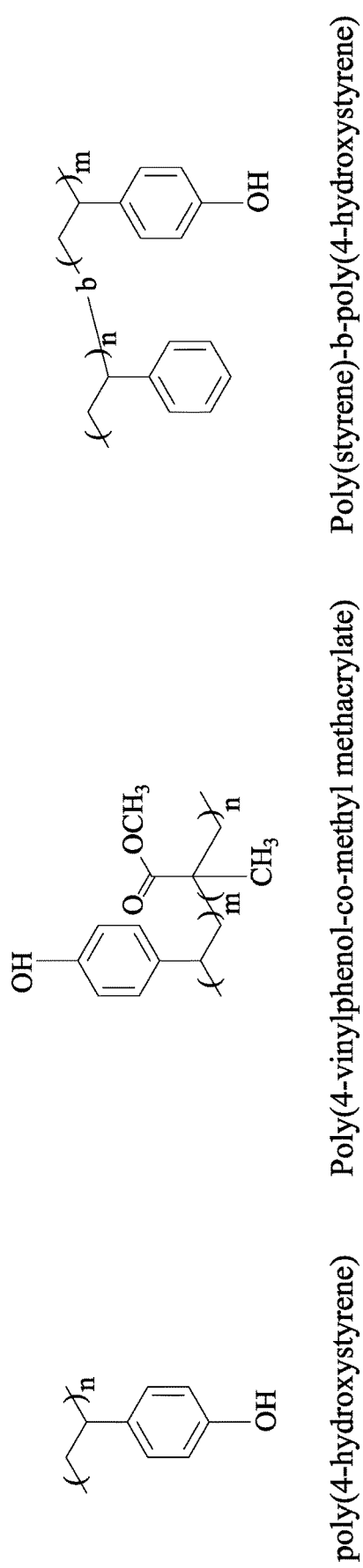
FIG. 11 illustrates polymers for bottom layer compositions according to embodiments of the disclosure.

FIG. 11 illustrates some components of the bottom layer, BARC, planarizing layer, or spin-on carbon layer (the bottom layer) composition according to some embodiments of the disclosure. In some embodiments, the bottom layer composition includes an organic polymer, including, but not limited to polyhydroxystyrenes, polyacrylates, polymethacrylates, polyvinylphenols, polystyrenes, and copolymers thereof. In some embodiments, the organic polymer is a poly(4-hydroxystyrene), a poly(4-vinylphenol-co-methyl methacrylate) copolymer, and a poly(styrene)-b-poly(4-hydroxystyrene) copolymer, as illustrated in FIG. 11.

In some embodiments, the bottom layer composition includes a carbon backbone polymer, a first crosslinker, and a second crosslinker.

In some embodiments, the first crosslinker is one or more selected from the group consisting of A-(OR)$_x$, A-(NR)$_x$,

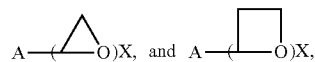

where A is a monomer, oligomer, or a second polymer having a molecular weight ranging from about 100 to about 20,000; R is an alkyl group, cycloalkyl group, cycloalkylepoxy group, or C3-C15 heterocyclic group; OR is an alkyloxy group, cycloalkyloxy group, carbonate group, alkylcarbonate group, alkyl carboxylate group, tosylate group, or mesylate group; NR is an alkylamide group or an alkylamino group; and x ranges from 2 to about 1000. In some embodiments, the molecular weight of the oligomer or second polymer is weight average molecular weight. In some embodiments, R is $(CH_2)_yCH_3$, where $0 \leq y \leq 14$. In some embodiments, OR is $(-O(CH_2CH_2O)_a-CH_2CH_3)$, where $1 \leq a \leq 6$. In some embodiments, R, OR, and NR include a chain structure, a ring structure, or a 3-D structure. In some embodiments, the 3-D structure is selected from the group consisting of norbornyl, adamantyl, basketanyl, twistanyl, cubanyl, and dodecahedranyl groups.

In some embodiments, the second crosslinker is one or more selected from the group consisting of A-(OH)$_x$, A-(OR')$_x$, A-(C≡C)$_x$, and A-(CC)$_x$, where A is a monomer, oligomer, or a second polymer having a molecular weight ranging from 100 to 20,000; R' is an alkyloxy group, an alkenyl group, or an alkynyl group; and x ranges from 2 to about 1000. In some embodiments, R is $(CH_2)_yCH_3$, where $0 \leq y \leq 14$. In some embodiments, R and OR include a chain structure, a ring structure, or a 3-D structure. In some embodiments, the 3-D structure is selected from the group consisting of norbornyl, adamantyl, basketanyl, twistanyl, cubanyl, and dodecahedranyl groups.

In some embodiments, the carbon backbone polymer contains crosslinking sites on the polymer.

In some embodiments, a concentration of the first and second crosslinkers ranges from about 20 wt. % to about 50 wt. % of the total weight of the first and second crosslinkers and the carbon backbone polymer. In some embodiments, less than about 20 wt. % of the crosslinkers results in insufficient crosslinking. In some embodiments, more than about 50 wt. % of the crosslinkers provides no or only negligible improvement in the crosslinking. In some embodiments, the concentration of the first crosslinker ranges from about 5 wt. % to about 40 wt. % of the total weight of the first and second crosslinkers and the carbon backbone polymer. In some embodiments, the concentration of the second crosslinker ranges from about 5 wt. % to about 40 wt. % of the total weight of the first and second crosslinkers and the carbon backbone polymer. In some embodiments, the concentration of the first crosslinker is about the same as the concentration of the second crosslinker.

The bottom layer 110 is subjected to a first heating at a temperature ranging from about 100° C. to about 170° C. in some embodiments to form a partially crosslinked layer. In some embodiments, the first heating is at a temperature ranging from about 100° C. to about 150° C.

The viscosity of the bottom layer composition is selected so that it provides a target thickness when it is spin-coated on the substrate. In some embodiments, the bottom layer composition has a viscosity of between about 0.1 to about $1 \times 10^6$ Pa·s at about 20° C. and is spin coated on the substrate at about 1500 rpm. The first heating at about 100° C. to about 170° C. causes partial polymer crosslinking and increases viscosity from about $0.11 \times 10^6$ Pa·s to about 100 Pa·s to about $1\times10^8$ Pa·s in some embodiments. The second heating at about 170° C. to about 300° C. causes further polymer crosslinking and increases the viscosity from about 100 Pas to about $1\times10^8$ Pa·s to a solid state layer. First heating temperatures below about 100° C. may result in insufficient partial crosslinking. First heating temperatures above about 170° C. may result in negligible additional partial crosslinking, or may prematurely trigger the second crosslinker. In some embodiments, the bottom layer 110 is heated at the first temperature for about 10 seconds to about 5 minutes to partially crosslink the bottom layer 110. In some embodiments, the first heating is performed for about 30 seconds to about 3 minutes. In some embodiments, the second heating is performed for about 30 seconds to about 3 minutes.

After the first heating, the bottom layer 110 is allowed to cool at about 20° C. to about 25° C. for about 10 s to about 1 min in some embodiments. Then the bottom layer 110 is subsequently subjected to a second heating at a second temperature higher than the first temperature to form a further or fully crosslinked bottom layer 110. In some embodiments, the second temperature ranges from about 170° C. to about 300° C. In some embodiments, the second temperature ranges from about 180° C. to about 300° C. In some embodiments, the second temperature ranges from about 200° C. to about 280° C. Second heating at temperatures below about 170° C. may result in insufficient crosslinking. Second heating temperatures above about 300° C. or 400° C. may result in an unacceptable increase in layer reflow or decomposition or degradation of the organic material forming the layer 110. In some embodiments, the layer 110 is heated at the second temperature for about 30 seconds to about 3 minutes. In other embodiments, the second heating is performed for about 30 seconds to about 2 minutes. After the second heating, the bottom layer is allowed to cool at about 20° C. to about 25° C. for about 10 s to about 1 min before performing subsequent processes.

Figure 12:
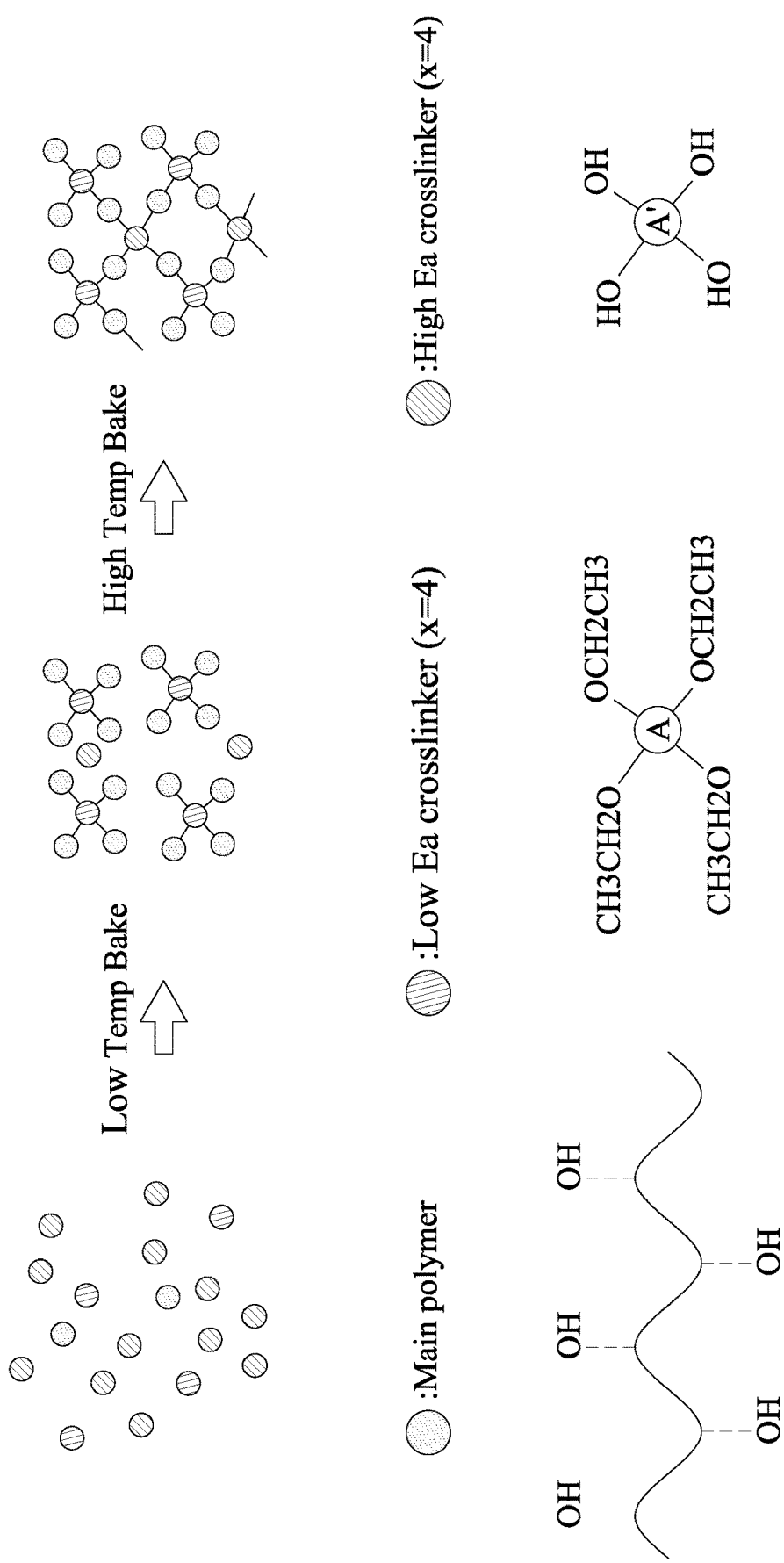
FIG. 12 illustrates polymers for bottom layer compositions according to embodiments of the disclosure.

FIG. 12 illustrates an example of the crosslinking operations in the bottom layer 110 according to embodiments of the disclosure. In an embodiment, the bottom layer includes a main polymer, such as polyhydroxystyrene, a low activation energy (Ea) crosslinker with four alkoxy crosslinking groups, and a high activation energy (Ea) crosslinker with four hydroxyl groups. The bottom layer is subjected to a low temperature baking operation, such as heating at about 130° C., which triggers the low Ea crosslinker to partially crosslink the main polymer. Then, a high temperature baking operation is performed, such as heating at about 250° C., which triggers the high Ea crosslinker to more fully crosslink the main polymer.

Figure 13:
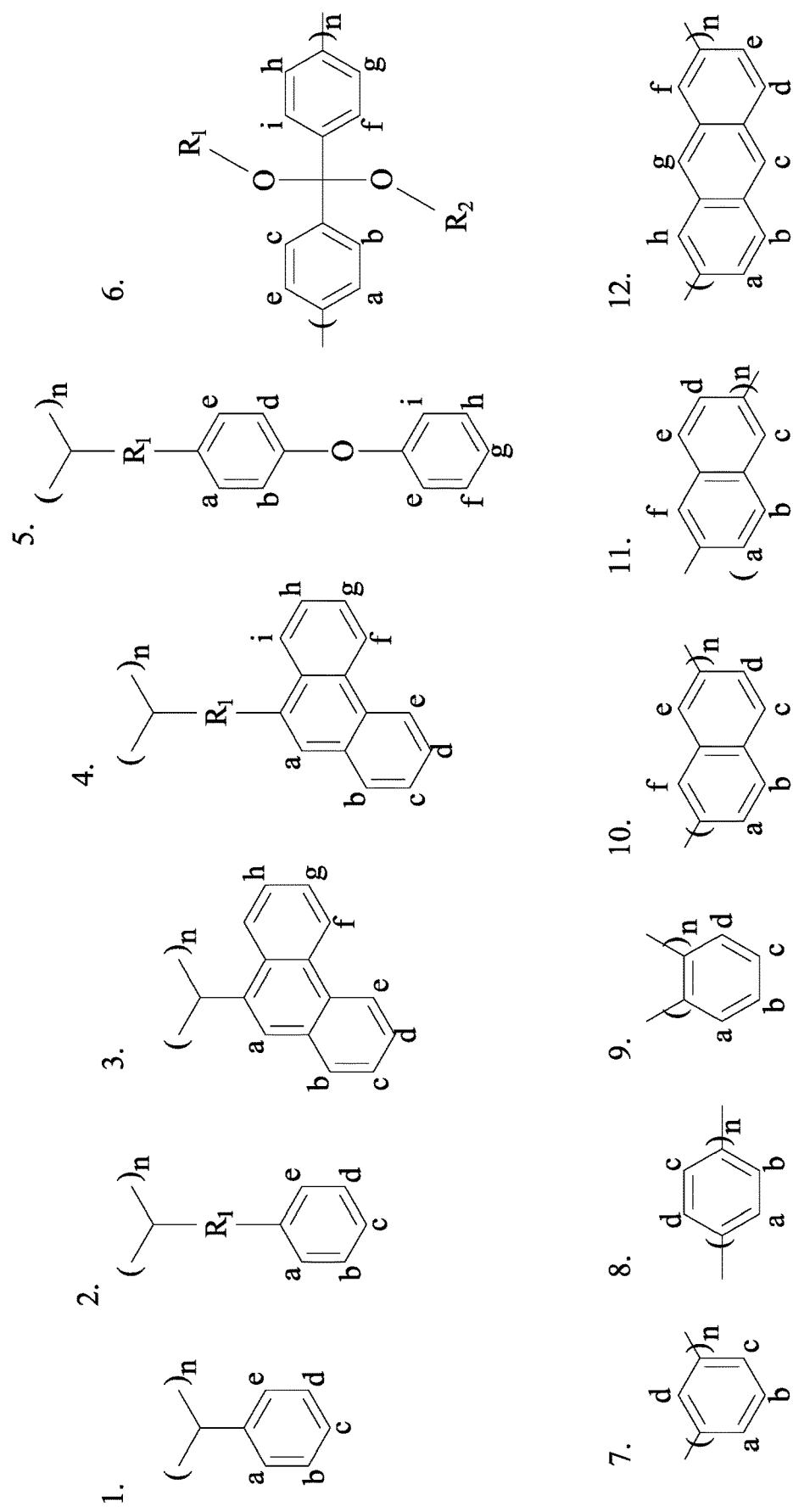
FIG. 13 illustrates polymers for bottom layer compositions according to embodiments of the disclosure.
Figure 14A:
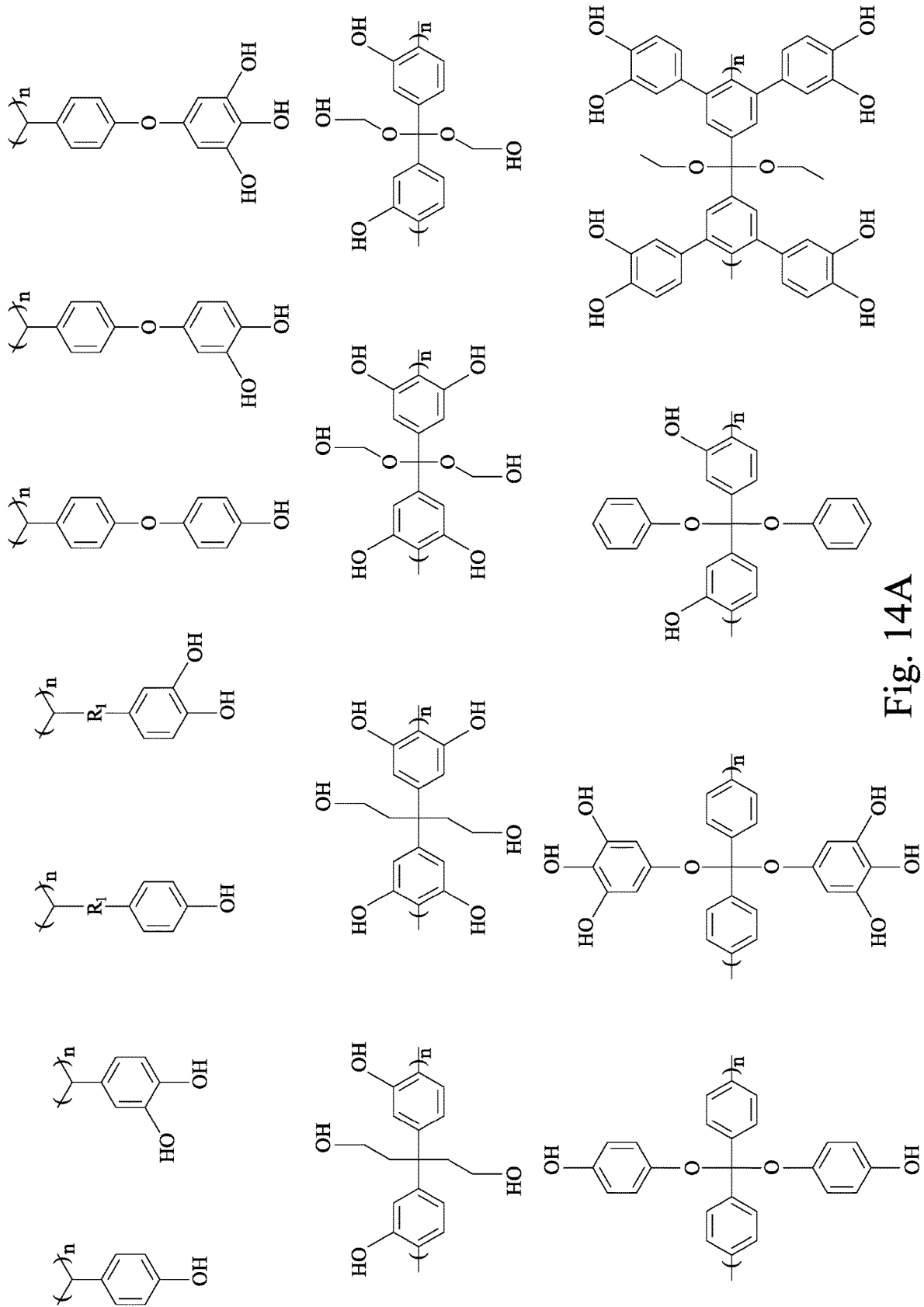
FIGS. 14A, 14B, and 14C illustrate polymers for bottom layer compositions according to embodiments of the disclosure.
Figure 14B:
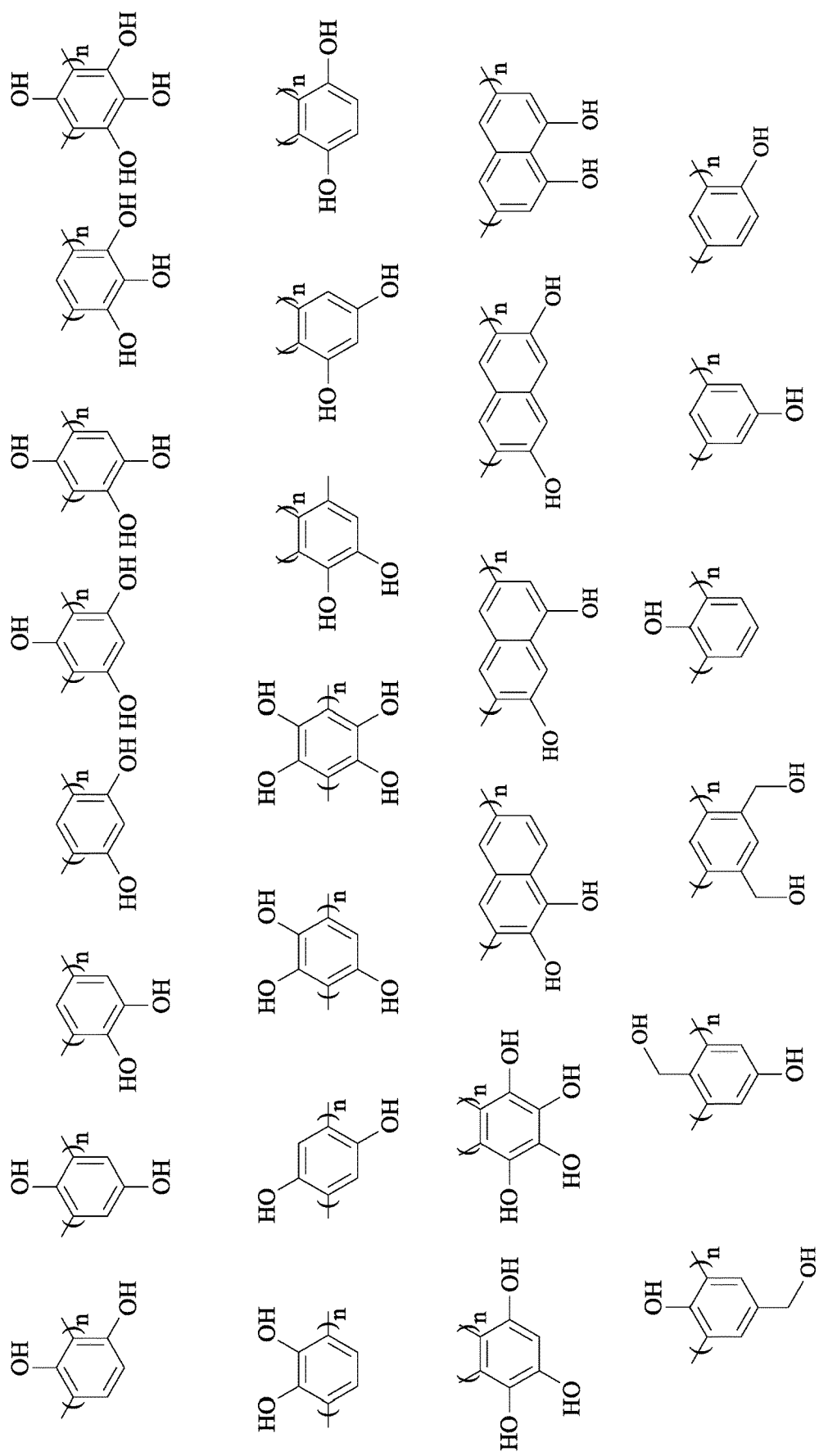
Figure 14C:
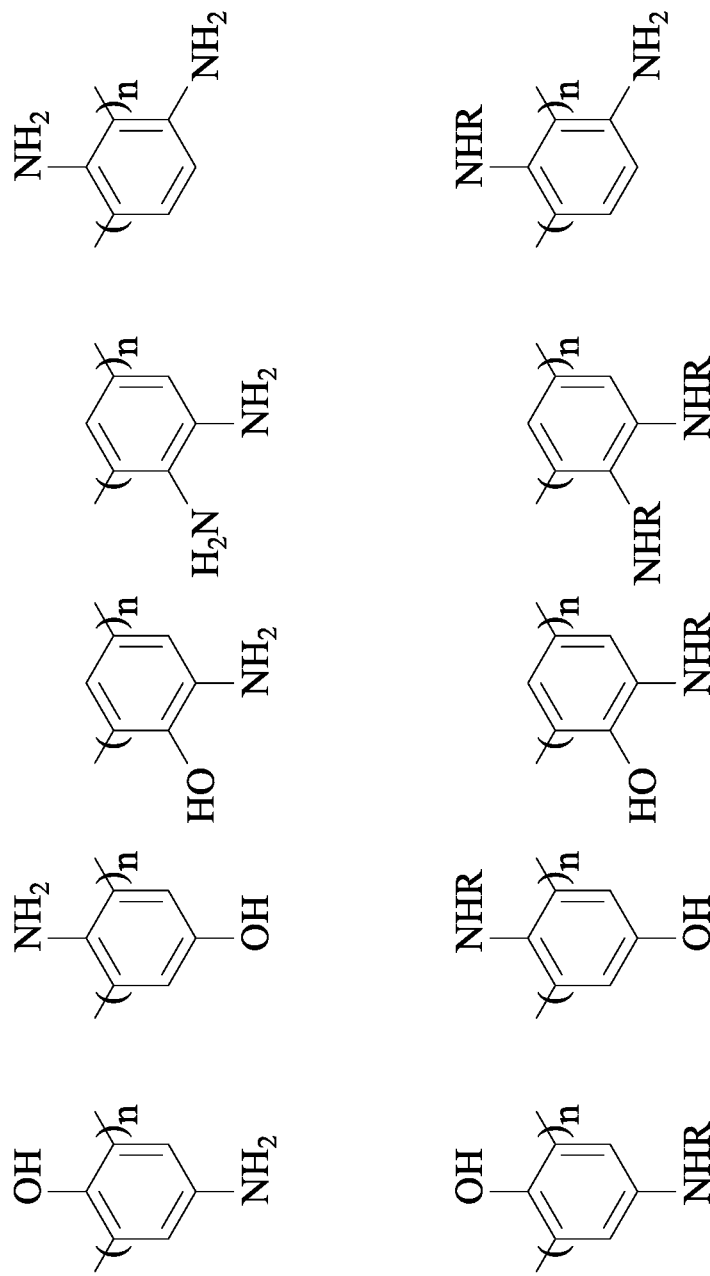

In some embodiments, the bottom layer is made of a polymer composition including polymers having one or more of repeating units 1-12 of FIG. 13. In FIG. 13, a, b, c, d, e, f, g, h, and i are each independently H, —OH, —ROH, —R(OH)$_2$, —NH$_2$, —NHR, —NR$_2$, —SH, —RSH, or —R(SH)$_2$, wherein at least one of a, b, c, d, e, f, g, h, and i on each repeating unit 1-12 is not H. R, R$_1$, and R$_2$ are each independently a C1-C10 alkyl group, a C3-C10 cycloalkyl group, a C1-C10 hydroxyalkyl group, a C2-C10 alkoxy group, a C2-C10 alkoxy alkyl group, a C2-C10 acetyl group, a C3-C10 acetylalkyl group, a C1-C10 carboxyl group, a C2-C10 alkyl carboxyl group, or a C4-C10 cycloalkyl carboxyl group, and n is 2-1000. Polymers formed of the repeating units 1-12 of FIG. 13 may crosslink upon heating or exposure to actinic radiation. In some embodiments, the bottom layer composition includes one or more of a crosslinker or a coupling reagent. The crosslinker crosslinks the bottom layer composition when heated or exposed to actinic radiation. Examples of repeating units 1-12 according to embodiments of the disclosure are shown in FIGS. 14A, 14B, and 14C. In some embodiments, each of the repeating units include two or more functional groups.

In some embodiments, the polymer includes repeating units having one or more of hydroxyl groups, amine groups, or mercapto groups. In some embodiments, each repeating unit includes at least two functional groups selected from one or more of —OH, —ROH, —R(OH)$_2$, —NH$_2$, —NHR, —NR$_2$, —SH, —RSH, or —R(SH)$_2$, wherein R is a C1-C10 alkyl group, a C3-C10 cycloalkyl group, a C1-C10 hydroxyalkyl group, a C2-C10 alkoxy group, a C2-C10 alkoxy alkyl group, a C2-C10 acetyl group, a C3-C10 acetylalkyl group, a C1-C10 carboxyl group, a C2-C10 alkyl carboxyl group, or a C4-C10 cycloalkyl carboxyl group.

In some embodiments, the bottom layer composition includes a polymer having one or more of the repeating units disclosed in FIGS. 13-14C disclosed herein. In some embodiments, at least one repeating unit includes three or more of —OH, —ROH, —R(OH)$_2$, —NH$_2$, —NHR, —NR$_2$, —SH, —RSH, or —R(SH)$_2$. In some embodiments, the polymer includes at least one repeating unit having three or more —OH groups.

In some embodiments the crosslinker has the following structure:

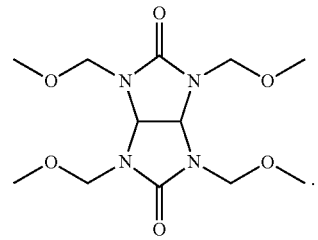

In other embodiments, the crosslinker has the following structure:

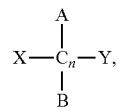

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the crosslinker include the following:

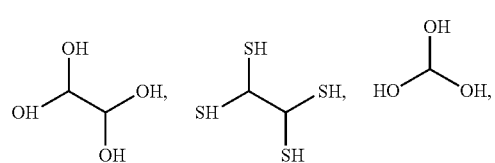

-continued

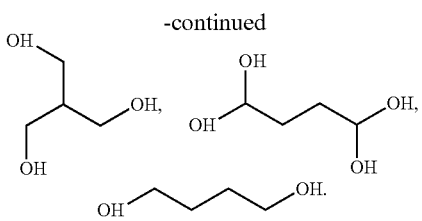

Alternatively, instead of or in addition to the crosslinker being added to the bottom layer composition, a coupling reagent is added in some embodiments. The coupling reagent assists the crosslinking reaction by reacting with the groups on the hydrocarbon structure in the polymer before the crosslinker, allowing for a reduction in the reaction energy of the crosslinking reaction and an increase in the rate of reaction. The bonded coupling reagent then reacts with the crosslinker, thereby coupling the crosslinker to the polymer.

Alternatively, in some embodiments in which the coupling reagent is added to the bottom layer composition without the crosslinker, the coupling reagent is used to couple one group from one of the hydrocarbon structures in the polymer to a second group from a separate one of the hydrocarbon structures in order to crosslink and bond the two polymers together. However, in such an embodiment the coupling reagent, unlike the crosslinker, does not remain as part of the polymer, and only assists in bonding one hydrocarbon structure directly to another hydrocarbon structure.

In some embodiments, the coupling reagent has the following structure:

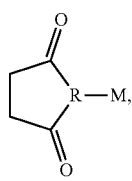

where R is a carbon atom, a nitrogen atom, a sulfur atom, or an oxygen atom; M includes a chlorine atom, a bromine atom, an iodine atom, —NO$_2$; —SO$_3$—; —H—; —CN; —NCO, —OCN; —CO$_2$—; —OH; —OR*, —OC(O)CR*; —SR; —SO$_2$N(R*)$_2$; —SO$_2$R*; SOR; —OC(O)R*; —C(O)OR*; —C(O)R*; —Si(OR*)$_3$; —Si(R*)$_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

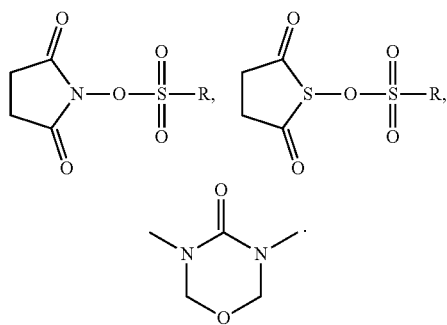

In some embodiments, the bottom layer 110 is formed by preparing a bottom layer coating composition of a polymer and optional crosslinker or coupling reagent in a solvent. The solvent can be any suitable solvent for dissolving the polymer. The bottom layer coating composition is applied over a substrate 10 or device features, such as by spin coating. Then the bottom layer composition is baked to dry the bottom layer and crosslink the polymer, as explained herein.

In some embodiments, the bottom layer composition includes a solvent. In some embodiments, the solvent is chosen such that the polymers and additives, such as crosslinkers, can be evenly dissolved into the solvent and dispensed upon the substrate.

In some embodiments, the solvent is an organic solvent, and includes one or more of any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the bottom layer include, acetone, methanol, ethanol, propanol, isopropanol (IPA), n-butanol, toluene, xylene, 4-hydroxy-4-methyl-2-pentanone, tetrahydrofuran (THF), methyl ethyl ketone, cyclohexanone (CHN), methyl isoamyl ketone, 2-heptanone (MAK), ethylene glycol, 1-ethoxy-2-propanol, methyl isobutyl carbinol (MIBC), ethylene glycol monoacetate, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, methyl acetate, ethyl acetate, propyl acetate, n-butyl acetate (nBA), methyl lactate, ethyl lactate (EL), propyl lactate, butyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethyl 3-ethoxypropionate, methyl 3-methoxypropionate, methyl 3-ethoxypropionate, and ethyl 3-methoxypropionate, β-propiolactone, β-butyrolactone, γ-butyrolactone (GBL), α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, propylene carbonate, vinylene carbonate, ethylene carbonate, butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylether, monophenylether, dipropylene glycol monoacetate, dioxane, methyl pyruvate, ethyl pyruvate, propyl pyruvate, methyl methoxypropionate, ethyl ethoxypropionate, n-methylpyrrolidone (NMP), 2-methoxyethyl ether (diglyme), ethylene glycol monomethyl ether, methyl propionate, ethyl propionate, propylene glycol methyl ether acetate (PGMEA), methylene cellosolve, 2-ethoxyethanol, N-methylformamide, N,N-dimethylformamide (DMF), N-methylformanilide, N-methylacetamide, N,N-dimethylacetamide, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, phenyl cellosolve acetate, or the like.

In some embodiments, the middle layer 115 includes a silicon-containing layer (e.g., a silicon hard mask material). The middle layer 115 may include a silicon-containing organic or inorganic polymer. In other embodiments, the middle layer includes a siloxane polymer. In other embodiments, the middle layer 115 includes silicon oxide (e.g., spin-on glass (SOG)), silicon nitride, silicon oxynitride, polycrystalline silicon; and/or other suitable materials. The middle layer 115 may be bonded to adjacent layers (e.g., bottom layer 110 and upper layer 120), such as by covalent bonding, hydrogen bonding, or hydrophilic-to-hydrophilic forces.

Thus, the middle layer 115 may include a composition that allows a covalent bond to be formed between the middle layer and the overlying photoresist layer 120 after an exposure process and/or subsequent baking process.

In some embodiments, the middle layer 115 includes a component having a photoacid generator (PAG). The PAG generates an acid that interacts with the exposed photoresist layer 120. In some embodiments, the middle layer 115 includes a polysiloxane having pendant PAG groups.

In some embodiments, a middle layer composition includes siloxane monomers and siloxane monomers with photoacid generator substituents. In some embodiments, a photoacid generator compound is first reacted with a siloxane, and then the reaction product, a siloxane having a photoacid generator group, is applied over the bottom layer 110, and then polymerized or crosslinked over the bottom layer 110. In some embodiments, the middle layer composition is a mixture of a spin-on-glass (SOG) and a photoacid generator. In some embodiments, the photoacid generator is first reacted with an SOG precursor and then reaction product is applied to the bottom layer 110 and cured. In some embodiments, a silicon-containing material and a photoacid generator are mixed together and the mixture is applied over the bottom layer. The mixture is subsequently heated to form a reaction product of the photoacid generator and the silicon-containing material after applying the mixture over the first layer in some embodiments. The reaction product is further heated to cause the reaction product to polymerize or crosslink. In some embodiments, the substrate or the middle layer composition is heated during the spin-coating operation, and the middle layer composition polymerizes or crosslinks during the application operation. The components of the middle layer composition are mixed in a solvent in some embodiments.

In some embodiments, the solvent is any of the solvents discussed herein used for forming the bottom layer. In some embodiments, the middle layer composition is applied over the bottom layer 110, and then the middle layer 115 is heated at temperature ranging from about 150° C. to about 300° C., as discussed herein in reference to operation S115 (FIG. 1). In some embodiments, the middle layer 115 is heated at temperature ranging from about 200° C. to about 250° C. The baking operation S120 causes the components of the middle layer composition to react, polymerize, or crosslink.

Figure 15A:
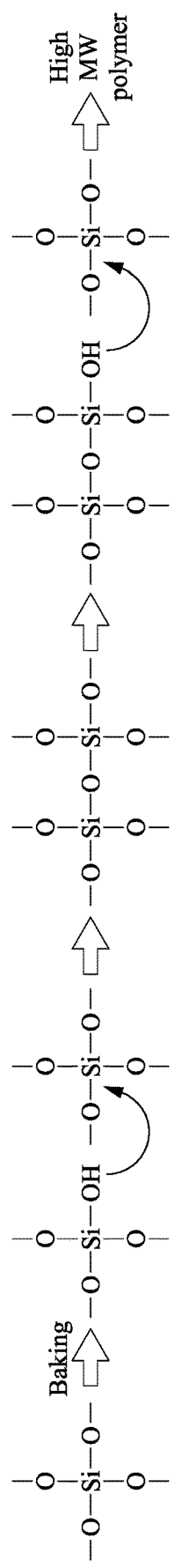
FIGS. 15A and 15B illustrate polymerization reactions of components of the middle layer according to embodiments of the disclosure.
Figure 15B:
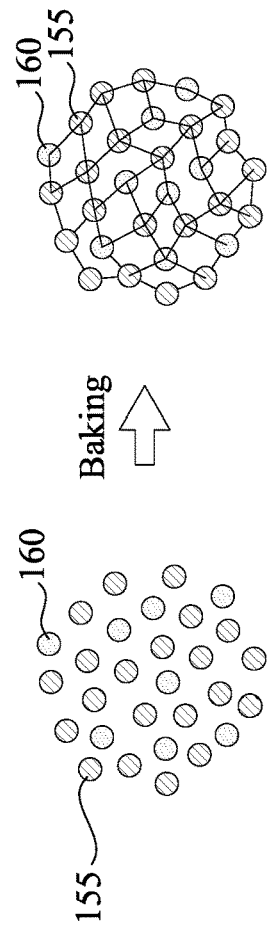

The polymerization reaction of siloxane monomers initiated by the baking operation S120 according to some embodiments is illustrated in FIG. 15A. In some embodiments, some of the siloxane monomers include pendant photoacid generator groups. As illustrated in FIG. 15B, in some embodiments, a mixture of siloxane monomers 155 and siloxane monomers substituted with PAG groups 160 is baked under baking conditions as disclosed herein. As a result of the baking, the monomers polymerize and crosslink in some embodiments, as shown in FIG. 15B.

A siloxane monomer having a PAG group according to some embodiments is shown below:

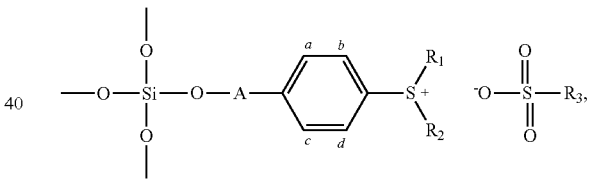

where A is a direct bond, a C1-C5 alkyl group, a C1-C5 cycloalkyl group, a C1-C5 hydroxy alkyl group, a C1-C5 alkoxy group, a C1-C5 alkoxyl alkyl group, a C1-05 acetyl group, a C1-05 acetyl alkyl group, a C1-C5 carboxyl group, or a C1-C5 alkyl carboxyl group; $R_1$ and $R_2$ are each independently a C6-C12 aryl group, a C6-C12 alkyl group, a C6-C12 cycloalkyl group, a C6-C12 hydroxy alkyl group, a C6-C12 alkoxy group, a C6-C12 alkoxyl alkyl group, a C6-C12 acetyl group, a C6-C12 acetyl alkyl group, a C6-C12 carboxyl group, a C6-C12 alkyl carboxyl group, a C6-C12 cycloalkyl carboxyl group, a C3-C15 saturated or unsaturated hydrocarbon ring or a C2-C15 heterocyclic group; $R_3$ is a C1-C20 fluorocarbon group, a C6-C20 aryl group, or a C10-C20 adamantyl group; and a, b, d, and d are each independently H or a C1-C6 alkyl group. In some embodiments, R1, R2, and R3 independently contain one to three iodine atoms.

The photoacid generator group can be any suitable photoacid generator. In some embodiments, the photoacid generator group includes an anion and a cation. In some embodiments, the photoacid generator group includes a cationic group bound to the siloxane. In some embodiments, the photoacid generator includes an onium cation. In some embodiments, the onium cation is a sulfonium. In some embodiments, the sulfonium is a triphenyl sulfonium. In some embodiments, the anion is a sulfite anion. In some embodiments, the anion is a sulfite anion with an organic group substituent. In some embodiments, the anion includes a fluorocarbon substituent group.

Figure 16A:
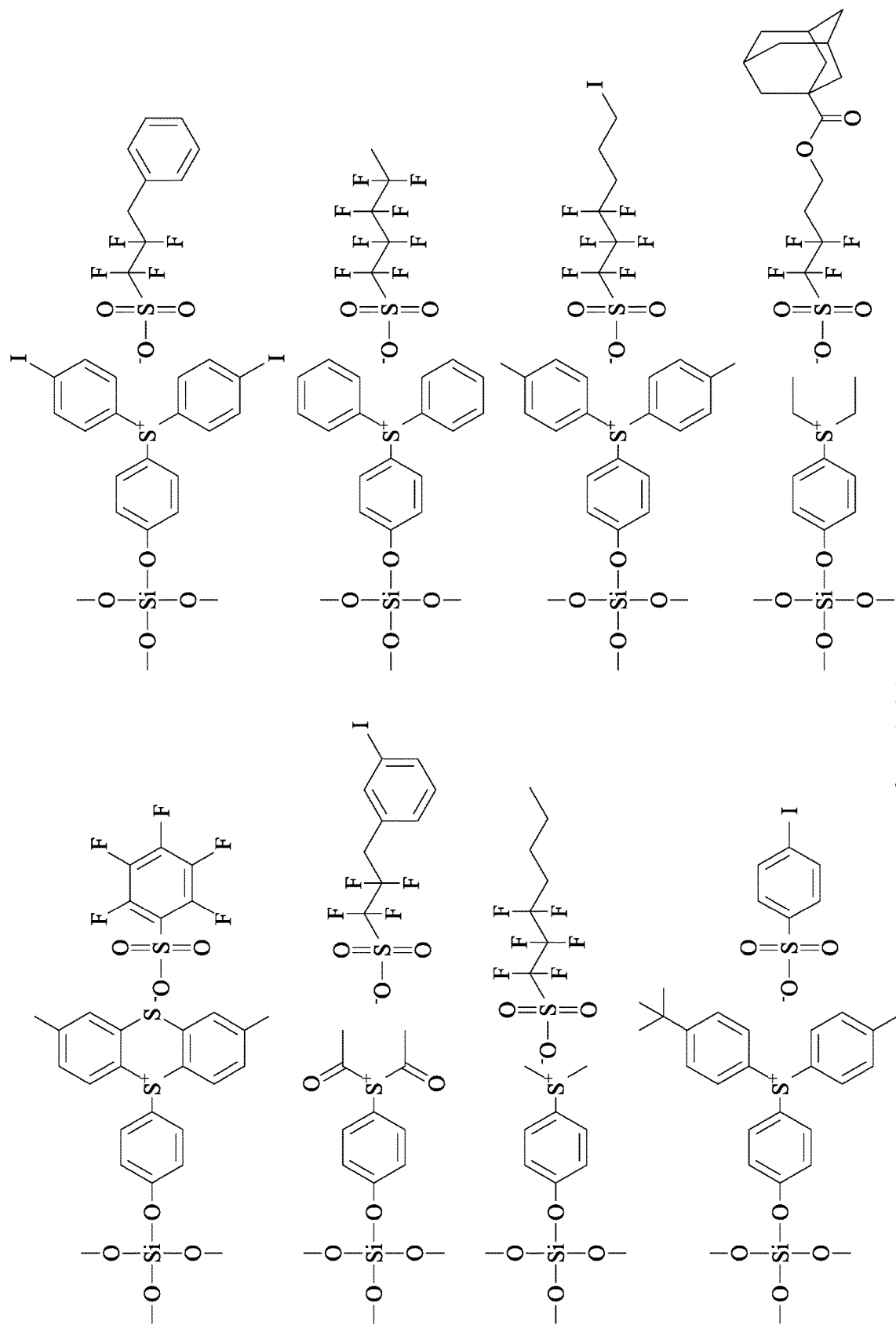
FIGS. 16A and 16B illustrate photoacid generator monomer units according to embodiments of the disclosure.
Figure 16B:
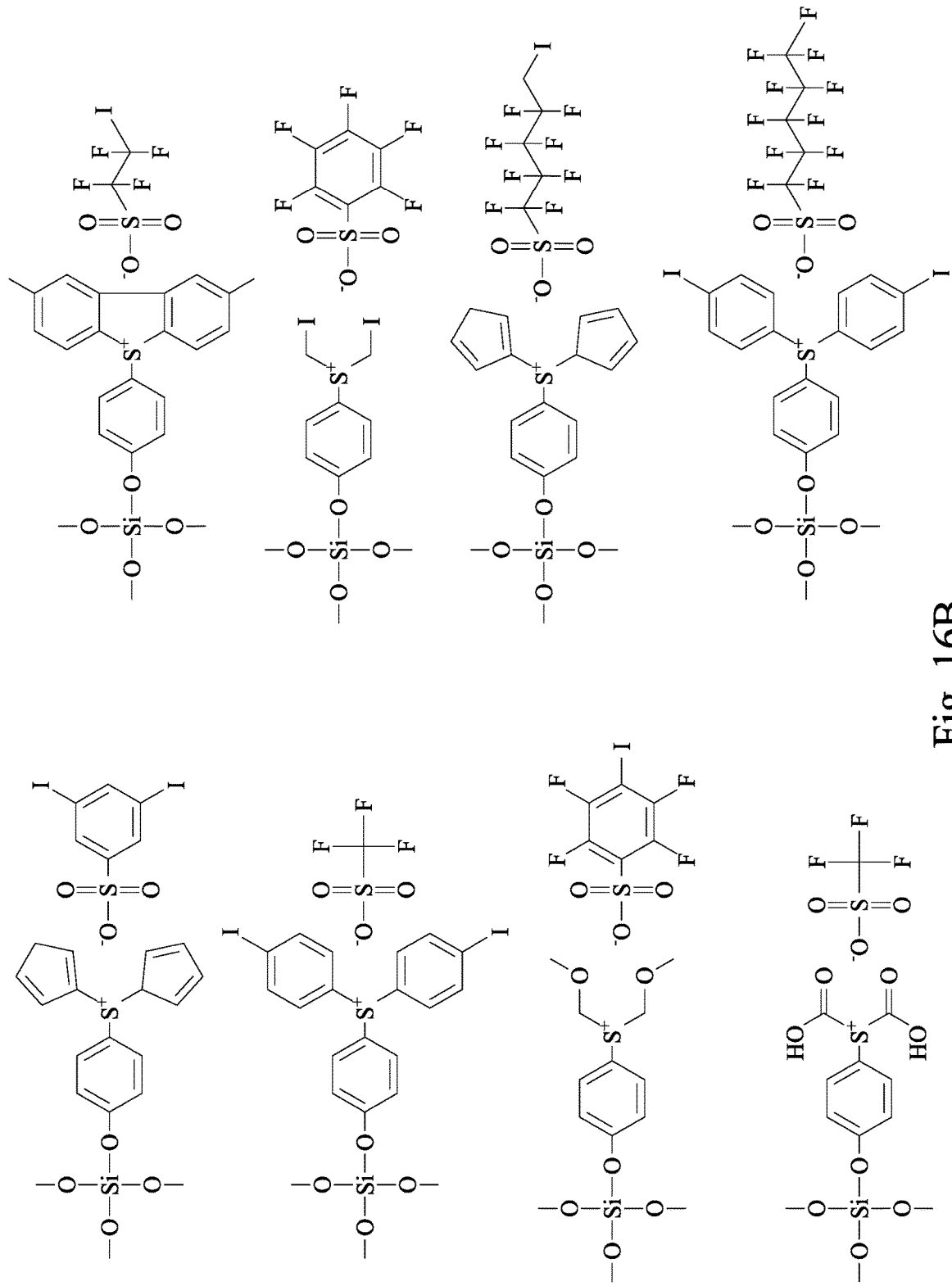

FIGS. 16A and 16B illustrate examples of photoacid generator monomer units according to embodiments of the disclosure.

Figure 17:
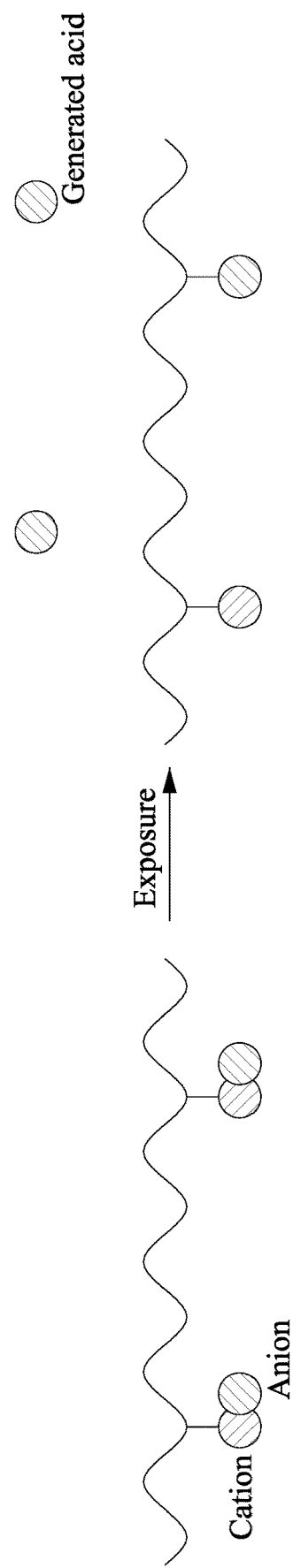
FIG. 17 illustrates the acid generation reaction of polymer bound photoacid generators according to an embodiment of the disclosure.

FIG. 17 illustrates the acid generation reaction according to embodiments of the disclosure. A photoacid generator including a cation and an anion is bonded to a polymer. The cationic polymer bound PAG does not diffuse to the photosensitive layer 120 because it is bound to the middle layer polymer during the photoresist coating process. When exposed to actinic radiation, the anion (the acid) is released from the PAG group. After exposure to actinic radiation, the generated acid is free to diffuse to the photosensitive layer. The subsequent post exposure baking operation S140, accelerates the diffusion of the acid into the exposed portions of the photosensitive layer 120.

The photosensitive layer 120 is a photoresist layer that is patterned by exposure to actinic radiation in some embodiments. Typically, the chemical properties of the photoresist regions struck by incident radiation change in a manner that depends on the type of photoresist used. Photoresist layers 120 are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive tone or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

In some embodiments, resist compositions according to embodiments of the disclosure, such as a photoresist, include a polymer or a polymerizable monomer or oligomer along with one or more photoactive compounds (PACs). In some embodiments, the concentration of the polymer, monomer, or oligomer ranges from about 1 wt. % to about 75 wt. % based on the total weight of the resist composition. In other embodiments, the concentration of the polymer, monomer, or oligomer ranges from about 5 wt. % to about 50 wt. %. At concentrations of the polymer, monomer, or oligomer below the disclosed ranges the polymer, monomer, or oligomer has negligible effect on the resist performance. At concentrations above the disclosed ranges, there is no substantial improvement in resist performance or there is degradation in the formation of consistent resist layers.

In some embodiments, the polymerizable monomer or oligomer includes an acrylic acid, an acrylate, a hydroxystyrene, or an alkylene. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, hydroxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the polymer is a polyhydroxystyrene, a polymethyl methacrylate, or a polyhydroxystyrene-t-butyl acrylate, e.g.—

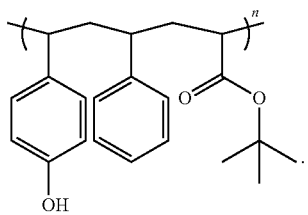

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decompose, otherwise known as a leaving group or, in some embodiments in which the PAC is a photoacid generator, an acid labile group, is attached to the hydrocarbon structure so that, it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl) methylene group, an (alkylsulfonyl)(alkyl-carbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the polymer also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer includes groups that can assist in increasing the adhesiveness of the photoresist layer 120 to the underlying middle layer 115. Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group, which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (meth)acrylate, combinations of these, or the like.

In some embodiments, such as when EUV radiation is used, the photoresist compositions according to the present disclosure are metal-containing resists. The metal-containing resists include metallic cores complexed with one or more ligands in a solvent. In some embodiments, the resist includes metal particles. In some embodiments, the metal particles are nanoparticles. As used herein, nanoparticles are particles having an average particle size between about 1 nm and about 20 nm. In some embodiments, the metallic cores, including from 1 to about 18 metal particles, are complexed with one or more organic ligands in a solvent. In some embodiments, the metallic cores include 3, 6, 9, or more metal nanoparticles complexed with one or more organic ligands in a solvent.

In some embodiments, the metal particle is one or more of titanium (Ti), zinc (Zn), zirconium (Zr), nickel (Ni), cobalt (Co), manganese (Mn), copper (Cu), iron (Fe), strontium (Sr), tungsten (W), vanadium (V), chromium (Cr), tin (Sn), hafnium (Hf), indium (In), cadmium (Cd), molybdenum (Mo), tantalum (Ta), niobium (Nb), aluminum (Al), cesium (Cs), barium (Ba), lanthanum (La), cerium (Ce), silver (Ag), antimony (Sb), combinations thereof, or oxides thereof. In some embodiments, the metal particles include one or more selected from the group consisting of Ce, Ba, La, In, Sn, Ag, Sb, and oxides thereof.

In some embodiments, the metal nanoparticles have an average particle size between about 2 nm and about 5 nm. In some embodiments, the amount of metal nanoparticles in the resist composition ranges from about 0.5 wt. % to about 15 wt. % based on the weight of the nanoparticles and the solvent. In some embodiments, the amount of nanoparticles in the resist composition ranges from about 5 wt. % to about 10 wt. % based on the weight of the nanoparticles and the solvent. In some embodiments, the concentration of the metal particles ranges from 1 wt. % to 7 wt. % based on the weight of the solvent and the metal particles. Below about 0.5 wt. % metal nanoparticles, the resist coating is too thin. Above about 15 wt. % metal nanoparticles, the resist coating is too thick and viscous.

In some embodiments, the metallic core is complexed by a ligand, wherein the ligand includes branched or unbranched, cyclic or non-cyclic, saturated organic groups, including C1-C7 alkyl groups or C1-C7 fluoroalkyl groups. The C1-C7 alkyl groups or C1-C7 fluoroalkyl groups include one or more substituents selected from the group consisting of —CF$_3$, —SH, —OH, =O, —S—, —P—, —PO$_2$, —C(=O)SH, —C(=O)OH, —C(=O)O—, —O—, —N—, —C(=O)NH, —SO$_2$OH, —SO$_2$SH, —SOH, and —SO$_2$—. In some embodiments, the ligand includes one or more substituents selected from the group consisting of —CF$_3$, —OH, —SH, and —C(=O)OH substituents.

In some embodiments, the ligand is a carboxylic acid or sulfonic acid ligand. For example, in some embodiments, the ligand is a methacrylic acid. In some embodiments, the metal particles are nanoparticles, and the metal nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen. In some embodiments, each metal particle is complexed by 1 to 25 ligand units. In some embodiments, each metal particle is complexed by 3 to 18 ligand units.

In some embodiments, the resist composition includes about 0.1 wt. % to about 20 wt. % of the ligands based on the total weight of the resist composition. In some embodiments, the resist includes about 1 wt. % to about 10 wt. % of the ligands. In some embodiments, the ligand concentration is about 10 wt. % to about 40 wt. % based on the weight of the metal particles and the weight of the ligands. Below about 10 wt. %, ligand, the organometallic photoresist does not function well. Above about 40 wt. %, ligand, it is difficult to form a consistent photoresist layer. In some embodiments, the ligand(s) is dissolved at about a 5 wt. % to about 10 wt. % weight range in a coating solvent, such as propylene glycol methyl ether acetate (PGMEA) based on the weight of the ligand(s) and the solvent.

In some embodiments, the copolymers and the PACs, along with any desired additives or other agents, are added to the solvent for application. Once added, the mixture is then mixed in order to achieve a homogenous composition throughout the photoresist to ensure that there are no defects caused by uneven mixing or nonhomogeneous composition of the photoresist. Once mixed together, the photoresist may either be stored prior to its usage or used immediately.

The solvent can be any suitable solvent, including the solvents used to coat the bottom layer composition, as described herein.

Some embodiments of the photoresist include one or more photoactive compounds (PACs). The PACs are photoactive components, such as photoacid generators (PAG), photobase (PBG) generators, photo decomposable bases (PDB), free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, oxime sulfonate, disulfone, o-nitrobenzylsulfonate, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments, the PAG in the photosensitive layer 120 includes an anion or a cation that is different from an anion or a cation of the photoacid generator bound to the polymer in the middle layer 115.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer; combinations of these, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a crosslinker or coupling reagent is added to the photoresist. The crosslinker reacts with one group from one of the hydrocarbon structures in the polymer resin and also reacts with a second group from a separate one of the hydrocarbon structures in order to crosslink and bond the two hydrocarbon structures together. This bonding and crosslinking increases the molecular weight of the polymer products of the crosslinking reaction and increases the overall linking density of the photoresist. Such an increase in density and linking density helps to improve the resist pattern. The coupling reagent assists the crosslinking reaction. The crosslinker or coupling reagent can be any of the crosslinkers or coupling reagents disclosed herein in reference to the bottom layer.

The individual components of the photoresist are placed into a solvent in order to aid in the mixing and dispensing of the photoresist. To aid in the mixing and dispensing of the photoresist, the solvent is chosen at least in part based upon the materials chosen for the polymer resin as well as the PACs. In some embodiments, the solvent is chosen such that the polymer resin and the PACs can be evenly dissolved into the solvent and dispensed upon the layer to be patterned.

In some embodiments, a quencher is added to the photoresist in some embodiments to inhibit diffusion of the generated acids/bases/free radicals within the photoresist. The quencher improves the resist pattern configuration as well as the stability of the photoresist over time.

Another additive added to the photoresist in some embodiments is a stabilizer, which assists in preventing undesired diffusion of the acids generated during exposure of the photoresist.

Another additive added to the photoresist in some embodiments is a dissolution inhibitor to help control dissolution of the photoresist during development.

A coloring agent is another additive added to the photoresist in some embodiments of the photoresist. The coloring agent observers examine the photoresist and find any defects that may need to be remedied prior to further processing.

Surface leveling agents are added to the photoresist in some embodiments to assist a top surface of the photoresist to be level, so that impinging light will not be adversely modified by an unlevel surface.

Once ready, the photoresist material is applied over the middle layer 115, as shown in FIG. 4, to form a photoresist layer 120. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 120 thickness ranges from about 10 nm to about 300 nm.

In some embodiments, the developer 57 is applied to the photoresist layer 120 using a spin-on process during the development operation S145. In the spin-on process, the developer 57 is applied to the photoresist layer 120 from above the photoresist layer 120 while the photoresist-coated substrate is rotated, as shown in FIG. 6. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 120 after exposure, it is intended to be illustrative and is not intended to limit the embodiment. Rather, any suitable development operations, including dip processes, puddle processes, and spray-on methods, may alternatively be used. All such development operations are included within the scope of the embodiments.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer is an aqueous solution, such as an aqueous solution of tetramethylammonium hydroxide. In other embodiments, the developer 57 is an organic solvent. The organic solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, 4-methyl-2-pentanol, acetone, methyl ethyl ketone, dimethylformamide (DMF), isopropanol (IPA), tetrahydrofuran (THF), methyl isobutyl carbinol (MIBC), n-butyl acetate (nBA), 2-heptanone (MAK), and dioxane.

In some embodiments, the trilayer resist of the present disclosure is used in the manufacture of semiconductor devices, such as a gate structure of a field effect transistor (FET). The embodiments such as those disclosed herein are generally applicable not only to planar FETs but also to a fin FET (FinFET), a double-gate FET, a surround-gate FET, an omega-gate FET or a gate-all-around (GAA) FET, and/or nanowire transistors, or any suitable device having one or more work function adjustment material (WFM) layers in the gate structure.

In FET structures, forming multiple devices with different threshold voltages (Vt), the composition and dimensions of metal gate layers play a crucial role in defining the Vt. Multiple FETs having different threshold voltages can be realized by adjusting materials and/or dimensions of one or more work function adjustment material (WFM) layers disposed between a gate dielectric layer and a body metal gate electrode layer (e.g., a W layer). If there is insufficient control of the photolithographic operations, the dimensions of the metal gate layers may not be consistent, which affects its work function and thereby affects threshold voltage and degrades device performance.

In the following embodiment, methods of providing WFM layers with consistent and controlled dimensions are discussed.

Figure 18:
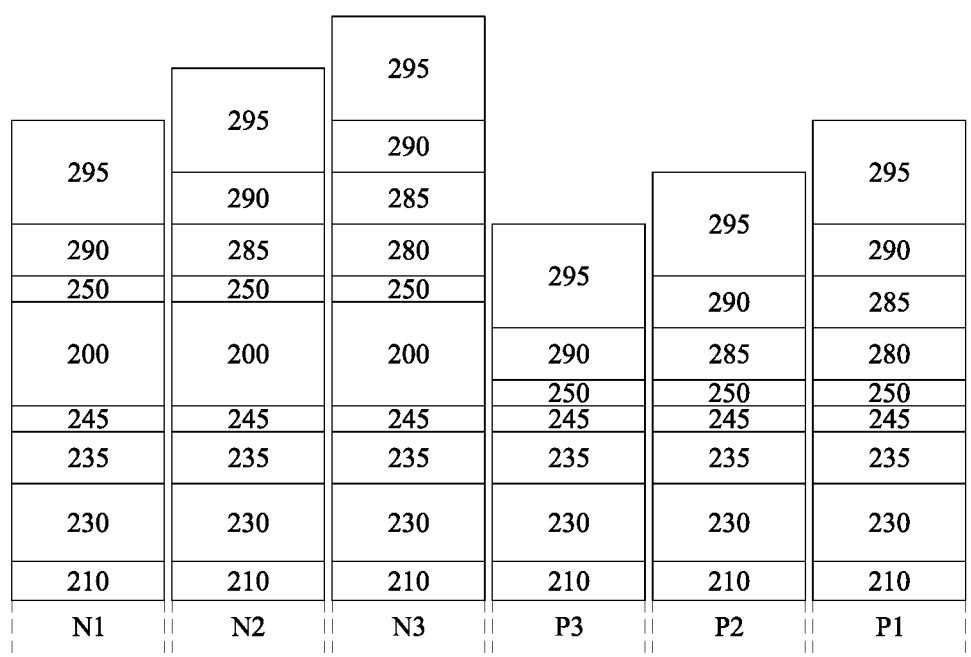
FIG. 18 shows a semiconductor device manufactured by a method according to an embodiment of the disclosure.

FIG. 18 shows a cross section view of gate structures for FETs with different threshold voltages according to an embodiment of the present disclosure. In some embodiments, a semiconductor device includes a first n-type FET N1, a second n-type FET N2, a third n-type FET N3, a first p-type FET P1, a second p-type FET P2 and a third p-type FET P3. A threshold voltage of the first n-type FET N1 is smaller in an absolute value than a threshold voltage of the second n-type FET N2 and the threshold voltage of the second n-type FET N2 is smaller in an absolute value than a threshold voltage of the third n-type FET N3. Similarly, a threshold voltage of the first p-type FET P1 is smaller in an absolute value than a threshold voltage of the second p-type FET P2 and the threshold voltage of the second p-type FET P2 is smaller in an absolute value than a threshold voltage of the third p-type FET P3.

FIGS. 19A-19R show cross sectional views of various stages of manufacturing the semiconductor device shown in FIG. 18, according to embodiments of the present disclosure. It is understood that in the sequential manufacturing process, one or more additional operations can be provided before, during, and after the stages shown FIGS. 190A-19R and some of the operations described below can be replaced or eliminated for additional embodiments of the method. The order of the operations/processes may be interchangeable. Accordingly, one or more operations as shown in FIGS. 19A-19R may be omitted or replaced with another operation depending on the structure of the semiconductor device.

FIG. 19A illustrates a plurality of channel regions of a first n-type FET N1, a second n-type FET N2, a third n-type FET N3, a first p-type FET P1, a second p-type FET P2 and a third p-type FET P3, respectively. An interfacial layer 210 is formed over each of the channel regions. A gate dielectric layer (e.g., a high-k gate dielectric layer) 230 is formed over each of the interfacial layers 210. A first conductive layer, as a cap layer 235, is formed over each of the gate dielectric layers 230.

In some embodiments, the interfacial layer 210 is formed by using chemical oxidation. In some embodiments, the interfacial layer 210 includes one of silicon oxide, silicon nitride and mixed silicon-germanium oxide. The thickness of the interfacial layer 210 is in a range from about 0.2 nm to about 6 nm in some embodiments. In some embodiments, the gate dielectric layer 230 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$ or other suitable high-k dielectric materials, and/or combinations thereof. The gate dielectric layer 230 may be formed by CVD, ALD or any suitable method. In one embodiment, the gate dielectric layer 230 is formed using a highly conformal deposition process such as ALD in order to ensure the formation of a gate dielectric layer having a uniform thickness around each channel layer. The thickness of the gate dielectric layer 230 is in a range from about 1 nm to about 100 nm in some embodiments. In some embodiments, the first conductive layer 235 is a TiN or TiSiN layer formed by CVD, ALD or any suitable method.

In some embodiments, a second conductive layer, as a first barrier layer 245, is formed on the cap layer 235, as shown in FIG. 19B. In some embodiments, the cap layer 235 is removed after an annealing operation and the first barrier layer 245 is not formed. In some embodiments, the second conductive layer 245 includes a metal nitride, such as WN, TaN, TiN and TiSiN. In some embodiments, TaN is used. The thickness of the second conductive layer 245 is in a range from about 0.3 nm to about 30 nm in some embodiments, and is in a range from about 0.5 nm to about 25 nm in other embodiments. In some embodiments, the second conductive layer 245 functions as a barrier layer or an etch stop layer. In some embodiments, the second conductive layer 245 is thinner than the first conductive layer 235.

As shown in FIG. 19C, a WFM layer 200 is formed in some embodiments. In some embodiments, the WFM layer 200 is an n-type WFM layer. In some embodiments, the WFM layer is made of a conductive material such as a single layer of TiN, WN, TaAlC, TiC, TaAl, TaC, Co, Al, TiAl, or TiAlC, or a multilayer of two or more of these materials. For an n-type FET, an aluminum containing layer, such as TiAl, TiAlC, TaAl and/or TaAlC is used as an n-type WFM layer 200, and for a p-type FET, one or more of TaN, TiN, WN, TiC, WCN, MoN and/or Co is used as a p-type WFM layer in some embodiments. In some embodiments, an n-type WFM layer is composed of materials having a low work function in a range from about 2.5 eV to about 4.4 eV and/or having low electronegativity. In some embodiments, a p-type WFM layer is composed of materials having a high work function in a range from about 4.3 eV to 5.8 eV and/or having high electronegativity. In some embodiments, a thickness of the n-type WFM layer 200 is in a range from about 0.6 nm to about 40 nm, and is in a range from about 1 nm to about 20 nm in other embodiments.

A first patterning operation is performed to remove the n-type WFM layer 200 from the regions for the first p-type FET P1, the second p-type FET P2 and the third p-type FET P3. In some embodiments, a bottom layer 260 made of the bottom layer compositions disclosed herein with reference to FIGS. 11-14C is formed over each of the n-type WFM layers 200. A middle layer 300 made according to the embodiments disclosed herein (e.g., FIGS. 3 and 15A-16B) is formed over each of the bottom layers 260, and a photoresist layer 205 made of any of the photoresist composition disclosed herein is formed over the each of the middle layers 300, as shown in FIG. 19D. By using one or more lithography operations, the photoresist layer 205 is patterned to expose the middle layers 300 at the regions for the p-type FETs. Then, the exposed middle layer 300 and bottom layer 260 are removed by one or more etching operations, to expose the n-type WFM layers 200 at the regions for the p-type FETs, as shown in FIG. 19E. A plasma etching operation utilizes a gas including $N_2$ and $H_2$, a gas including $O_2/Cl_2$, or $O_2$ gas in some embodiments.

Subsequently, the n-type WFM layer 200 in the regions for the p-type FETs are removed by an appropriate etching operation, as shown in FIG. 19F. In some embodiments, the etching operation includes a wet etching operation. The etching solution (etchant) includes an aqueous solution of HCl and $H_2O_2$, an aqueous solution of the combination of $NH_4OH$ and $H_2O_2$, an aqueous solution of the combination of HCl, $NH_4OH$ and $H_2O_2$, an aqueous solution of HF, $NH_4OH$ and $H_2O_2$ and/or an aqueous solution of $H_3PO_4$ and $H_2O_2$ in some embodiments. The wet etching substantially stops at the first barrier layer 245, which thus functions as an etch stop layer. In some embodiments, the gate dielectric layer 230 acts as an etch stop layer instead of first barrier layer.

After the wet etching operation, a wet cleaning operation or a deionized water rinsing is performed in some embodiments. The photoresist layer 205, middle layer 300, and the bottom layer 260 are removed are subsequently removed from the n-type FET regions, as shown in FIG. 19G. In some embodiments, a plasma ashing operation using an oxygen containing gas is performed to remove the organic photoresist layer 205, middle layer, and the bottom layer 260. In some embodiments, an $N_2/H_2$ based plasma or a $CF_4$ based plasma is used for the plasma ashing operation.

In some embodiments, a third conductive layer, as a second barrier layer 250, is formed over the n-type WFM layers 200 for the n-type FETs and over the first barrier layer 245 at the regions for the p-type FETs, as shown in FIG. 19H. A blanket layer of the second barrier layer 250 is formed over the regions of the n-type and p-type FETs in some embodiments. In some embodiments, TaN is used as the third conductive layer 250. The thickness of the third conductive layer 250 is in a range from about 0.3 nm to about 30 nm in some embodiments, and is in a range from about 0.5 nm to about 25 nm in other embodiments.

A blanket layer of a first p-type WFM layer 280 is formed over each of the second barrier layers 250 at the regions for the n-type and p-type FETs, as shown in FIG. 19I. In some embodiments, a thickness of the first p-type WFM layers 280 is in a range from about 0.5 nm to about 20 nm, and is in a range from about 1 nm to about 10 nm in other embodiments.

Figures 19K, 19L:
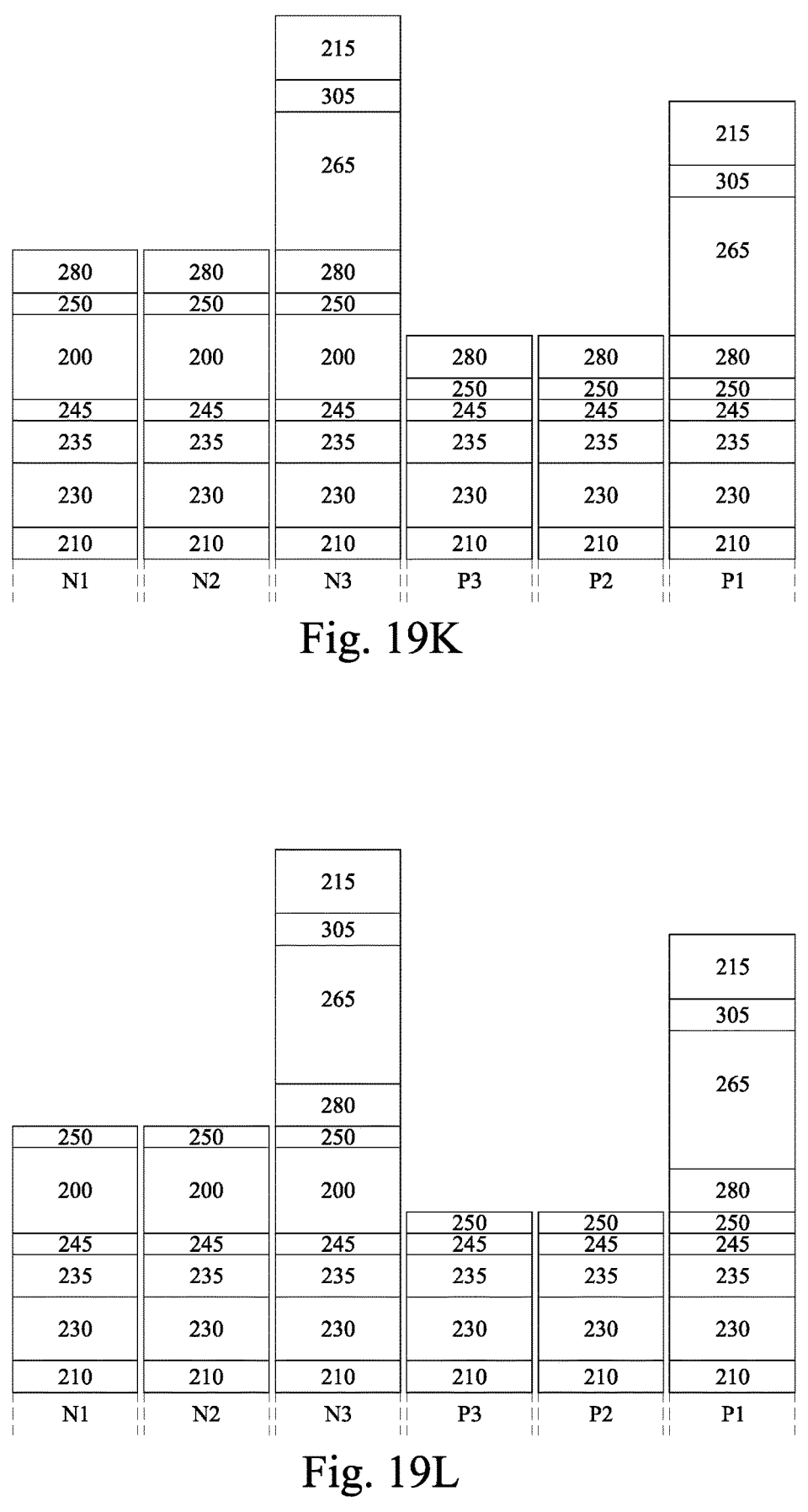

Next, a second patterning operation is performed to remove the first p-type WFM layer 280 from the regions for the first and second n-type FETs N1, N2 and the second and third p-type FETs P2, P3. A second bottom layer 265 made of the bottom layer compositions disclosed herein is formed over each of the first p-type WFM layers 280. A second middle layer 305 made of the middle layer compositions disclosed herein is formed over each of the second bottom layers, and a second photoresist layer 215 formed of any of the photoresist compositions disclosed herein is formed over the second middle layer 305, as shown in FIG. 19J. By using one or more lithography operations, the second photoresist layer 215 is patterned to expose the second middle layer 305 at the regions for the first and second n-type FETs N1, N2 and second and third p-type FETs P2, P3. Then, the exposed middle layer 305 and the second bottom layer 265 are removed by one or more plasma etching operations, to expose the first p-type WFM layer 280 at the regions for the first and second n-type FETs N1, N2 and second and third p-type FETs P2, P3, as shown in FIG. 19K. The plasma etching utilizes a gas including $N_2$ and $H_2$, a gas including $O_2/Cl_2$, or $O_2$ gas.

Subsequently, the first p-type WFM layer 280 in the regions for the first and second n-type FETs N1, N2 and second and third p-type FETs P2, P3 is removed by an appropriate etching operation, as shown in FIG. 19L. In some embodiments, the etching operation includes a wet etching operation. The etching solution (etchant) includes an aqueous solution of $H_3PO_4$ and $H_2O_2$, an aqueous solution of the combination of HCl, $NH_4OH$ and $H_2O_2$ in some embodiments. The wet etching substantially stops at the second barrier layer 250, which thus functions as an etch stop layer.

Figures 19M, 19N:
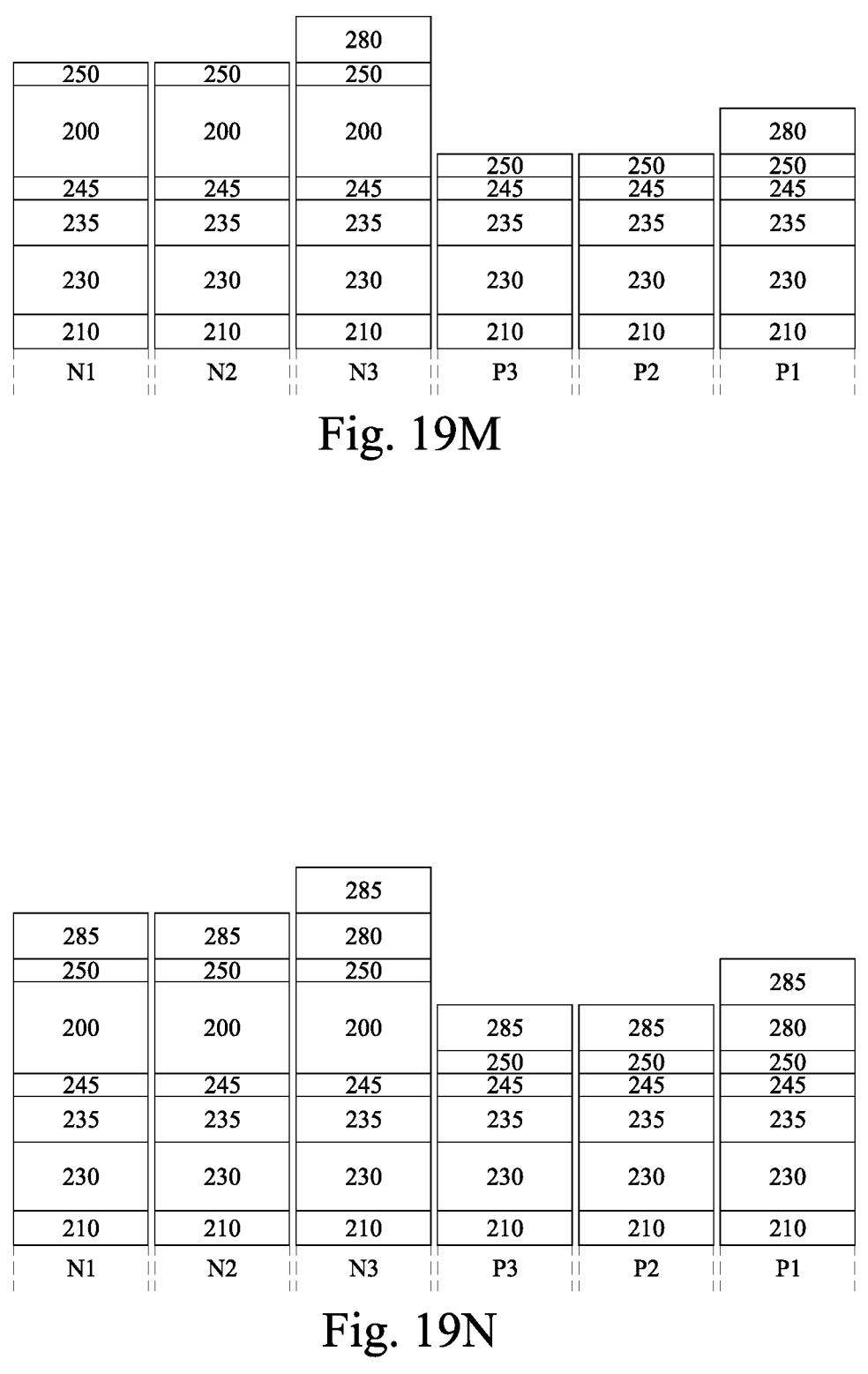

After the wet etching operation, a wet cleaning operation or a deionized water rinsing is performed in some embodiments. The second photoresist layer 215, second middle layer 305, and the second bottom layer 265 are subsequently removed as shown in FIG. 19M. In some embodiments, a plasma ashing operation using an oxygen containing gas is performed to remove the organic second photoresist layer 215, second middle layer, and second bottom layer 265. In some embodiments, an $N_2/H_2$ based plasma or a $CF_4$ based plasma is used for the plasma ashing operation.

A blanket layer of a second p-type WFM layer 285 is formed over the second barrier layer 250 at the regions for the first and second n-type FETs N1, N2 and the second and third p-type FETs P2, P3 and over the first p-type WFM layer 280 at the regions for the third n-type FET N3 and the first p-type FET P1 in some embodiments, as shown in FIG. 19N. In some embodiments, a thickness of the second p-type WFM layers 285 is in a range from about 0.5 nm to about 20 nm, and is in a range from about 1 nm to about 10 nm in other embodiments.

A third patterning operation subsequently is performed to remove the second p-type WFM layer 285 from the regions for the first n-type FET N1 and the third p-type FET P3. In some embodiments, a third bottom layer 270 made of the bottom layer compositions disclosed herein is formed over the second p-type WFM layer 285, a third middle layer 310 made of any of the middle layer compositions disclosed herein, and a third photoresist layer 225 made of any of the photoresist compositions disclosed herein are formed over the third bottom layer 270, as shown in FIG. 19O. By using one or more lithography operations, the third photoresist layer 225 is patterned, to expose the third middle layer 310 at the regions for the first n-type FET N1 and the third p-type FET P3. Then, the exposed third middle layer 310 and the third bottom layer 270 are removed by one or more plasma etching operations, to expose the second p-type WFM layer 285 at the regions for the first n-type FET N1 and the third p-type FET P3, as shown in FIG. 19P. The plasma etching utilizes a gas including $N_2$ and $H_2$, a gas including $O_2/Cl_2$, or $O_2$ gas.

Subsequently, the second p-type WFM layer 285 in the regions for the first n-type FET N1 and the third p-type FET P3 is removed by an appropriate etching operation, as shown in FIG. 19Q. In some embodiments, the etching operation includes a wet etching operation. The etching solution (etchant) includes an aqueous solution of $H_3PO_4$ and $H_2O_2$, an aqueous solution of the combination of HCl, $NH_4OH$, and $H_2O_2$ in some embodiments. The wet etching substantially stops at the second barrier layer 250, which thus functions as an etch stop layer.

After the wet etching operation, a wet cleaning operation or a deionized water rinsing is performed in some embodiments. The third photoresist layer 225, the third middle layer 310, and the third bottom layer 270 are subsequently removed as shown in FIG. 19R. In some embodiments, a plasma ashing operation using an oxygen containing gas is performed to remove the third photoresist layer 225, third middle layer 310, and the bottom layer 270. In some embodiments, an $N_2/H_2$ based plasma or a $CF_4$ based plasma is used for the plasma ashing operation.

A glue layer 290 is subsequently formed over the second barrier layer 250 at the regions for the first n-type FET N1 and the third p-type FET P3, over the second p-type WFM layer 285 at the regions for the second and third n-type FETs N2, N3 and the first and second p-type FETs P1, P2, and a body gate electrode layer 295 is formed over glue layer 290 in some embodiments to provide the semiconductor device shown in FIG. 18.

In some embodiments, the glue layer 290 is made of TiN, Ti, or Co. In some embodiments, the body gate electrode layer 295 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

Other embodiments include other operations before, during, or after the operations described above. In some embodiments, the disclosed methods include forming semiconductor devices, including fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

The novel middle layer compositions and semiconductor device manufacturing methods according to the present disclosure provide higher semiconductor device feature yield. Embodiments of the present disclosure include methods and materials that reduce scum defects, thereby improving pattern resolution, decreasing line width roughness, decreasing line edge roughness, and improving semiconductor device yield. Embodiments of the disclosure further enables the use of lower exposure doses to effectively expose and pattern the photoresist.

An embodiment of the disclosure is a method of manufacturing a semiconductor device including forming a first layer including an organic material over a substrate. A second layer including a reaction product of a silicon-containing material and a photoacid generator is formed over the first layer. A photosensitive layer is formed over the second layer, and the second layer is patterned. In an embodiment, the silicon-containing material is a siloxane or a spin-on-glass. In an embodiment, the photoacid generator includes a sulfonium cation. In an embodiment, the photoacid generator includes a triphenyl sulfonium cation. In an embodiment, the forming the second layer includes: applying a mixture including the reaction product of the silicon-containing material and the photoacid generator over the first layer; and heating the mixture to polymerize or crosslink the reaction product of the photoacid generator and the silicon-containing material after applying the mixture over the first layer. In an embodiment, the mixture is heated at a temperature ranging from 150° C. to 300° C. In an embodiment, the patterning the photosensitive layer includes: patternwise exposing the photosensitive layer to actinic radiation, heating the patternwise exposed photosensitive layer and the second layer at a temperature ranging from 80° C. to 160° C., and developing the photosensitive layer after the heating. In an embodiment, the photoacid generator includes a sulfonium cation and a sulfite anion.

Another embodiment of the disclosure is a method of manufacturing a semiconductor device, including forming a bottom anti-reflective coating layer over a substrate. A middle layer including a silicon-containing polymer with pendant photoacid generator groups is formed over the bottom anti-reflective coating layer. A photosensitive layer is formed over the middle layer. The photosensitive layer is selectively exposed to actinic radiation to form a latent pattern, and the photosensitive layer is selectively exposed to form a pattern in the photosensitive layer. In an embodiment, the silicon-containing polymer is a polysiloxane. In an embodiment, the photoacid generator groups include a sulfonium cation and a sulfite anion. In an embodiment, the photosensitive layer includes a polymer having pendant acid labile groups and a photoacid generator compound. In an embodiment, an anion or a cation of the photoacid generator compound is different from an anion or a cation of the pendant photoacid generator groups. In an embodiment, the method includes heating the selectively exposed photosensitive layer at a temperature ranging from 80° C. to 160° C. before the developing the selectively exposed photosensitive layer.

Another embodiment of the disclosure is a method of manufacturing a semiconductor device, including forming a bottom layer of a trilayer resist over a substrate and forming a middle layer of a trilayer resist over the bottom layer. The middle layer includes a silicon-containing material with pendant photoacid generator groups. A photosensitive layer is formed over the middle layer. The photosensitive layer and the middle layer are selectively exposed to actinic radiation. Acid released by the pendant photoacid generator groups in exposed portions of the middle layer is diffused into exposed portions of the photosensitive layer. A developer composition is applied to the selectively exposed photosensitive layer to form a pattern in the photosensitive layer. In an embodiment, the silicon-containing material is a polysiloxane or a cured spin-on-glass. In an embodiment, the diffusing acid released by the pendant photoacid generator groups in exposed portions of the middle layer into exposed portions of the photosensitive layer includes heating the photosensitive layer and the middle layer at a temperature ranging from 80° C. to 160° C. before the applying the developer. In an embodiment, forming the middle layer includes heating the middle layer at a temperature ranging from 150° C. to 300° C. to polymerize or crosslink the silicon-containing material with pendant photoacid generator groups. In an embodiment, the photosensitive layer includes a polymer having pendant acid labile groups and a photoacid generator compound. In an embodiment, an anion or a cation of the photoacid generator compound is different from an anion or a cation of the pendant photoacid generator groups.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of manufacturing a semiconductor device, comprising:
forming a first layer comprising an organic material over a substrate;
forming a second layer comprising a reaction product of a siloxane and a photoacid generator over the first layer, wherein the photoacid generator is bonded to a silicon in the siloxane through an oxygen;
forming a photosensitive layer over the second layer; and
patterning the photosensitive layer,
wherein the reaction product of the siloxane and the photoacid generator is

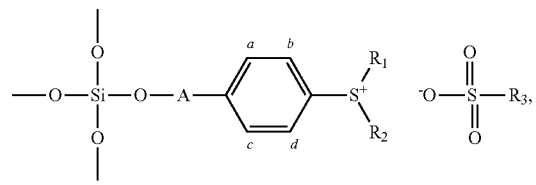

where A is a direct bond, a C1-C5 alkyl group, a C1-C5 cycloalkyl group, a C1-C5 hydroxy alkyl group, a C1-C5 alkoxy group, a C1-C5 alkoxyl alkyl group, a C1-C5 acetyl group, a C1-C5 acetyl alkyl group, a C1-C5 carboxyl group, or a C1-C5 alkyl carboxyl group; R1 and R2 are each independently a C6-C12 aryl group, a C6-C12 alkyl group, a C6-C12 cycloalkyl group, a C6-C12 hydroxy alkyl group, a C6-C12 alkoxy group, a C6-C12 alkoxyl alkyl group, a C6-C12 acetyl group, a C6-C12 acetyl alkyl group, a C6-C12 carboxyl group, a C6-C12 alkyl carboxyl group, a C6-C12 cycloalkyl carboxyl group, a C3-C15 saturated or unsaturated hydrocarbon ring or a C2-C15 heterocyclic group; R3 is a C1-C20 fluorocarbon group, a C6-C20 aryl group, or a C10-C20 adamantyl group; and a, b, c, and d are each independently H or a C1-C6 alkyl group, and R3 includes I.

2. The method according to claim 1, wherein the photoacid generator includes a sulfonium cation.

3. The method according to claim 1, wherein the photoacid generator includes a triphenyl sulfonium cation.

4. The method according to claim 1, wherein the forming the second layer comprises:
applying a mixture comprising the reaction product of the siloxane and the photoacid generator over the first layer; and
heating the mixture to polymerize or crosslink the reaction product of the photoacid generator and the silicon-containing material after applying the mixture over the first layer.

5. The method according to claim 4, wherein the mixture is heated at a temperature ranging from 150° C. to 300° C.

6. The method according to claim 1, wherein the patterning the photosensitive layer comprises:
patternwise exposing the photosensitive layer to actinic radiation;
heating the patternwise exposed photosensitive layer and the second layer at a temperature ranging from 80° C. to 160° C.; and
developing the photosensitive layer after the heating.

7. The method according to claim 1, wherein the photoacid generator includes a sulfonium cation and a sulfite anion.

8. A method of manufacturing a semiconductor device, comprising:
forming a bottom anti-reflective coating layer over a substrate;
forming a middle layer comprising a polysiloxane with pendant photoacid generator groups over the bottom anti-reflective coating layer,
wherein the photoacid generator groups are bonded to a silicon in the polysiloxane through an oxygen;
forming a photosensitive layer over the middle layer;
selectively exposing the photosensitive layer to actinic radiation to form a latent pattern; and
developing the selectively exposed photosensitive layer to form a pattern in the photosensitive layer,
wherein a monomer of the polysiloxane with the pendant photoacid generator groups is

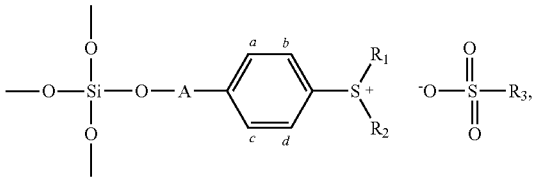

where A is a direct bond, a C1-C5 alkyl group, a C1-C5 cycloalkyl group, a C1-C5 hydroxy alkyl group, a C1-C5 alkoxy group, a C1-C5 alkoxyl alkyl group, a C1-C5 acetyl group, a C1-C5 acetyl alkyl group, a C1-C5 carboxyl group, or a C1-C5 alkyl carboxyl group; R1 and R2 are each independently a C6-C12 aryl group, a C6-C12 alkyl group, a C6-C12 cycloalkyl group, a C6-C12 hydroxy alkyl group, a C6-C12 alkoxy group, a C6-C12 alkoxyl alkyl group, a C6-C12 acetyl group, a C6-C12 acetyl alkyl group, a C6-C12 carboxyl group, a C6-C12 alkyl carboxyl group, a C6-C12 cycloalkyl carboxyl group, a C3-C15 saturated or unsaturated hydrocarbon ring or a C2-C15 heterocyclic group; R3 is a C1-C20 fluorocarbon group, a C6-C20 aryl group, or a C10-C20 adamantyl group; a, b, c, and d are each independently H or a C1-C6 alkyl group, and R3 includes I.

9. The method according to claim 8, wherein the photoacid generator groups include a sulfonium cation and a sulfite anion.

10. The method according to claim 8, wherein the photosensitive layer comprises a polymer having pendant acid labile groups and a photoacid generator compound.

11. The method according to claim 10, wherein an anion or a cation of the photoacid generator compound is different from an anion or a cation of the pendant photoacid generator groups.

12. The method according to claim 8, further comprising heating the selectively exposed photosensitive layer at a temperature ranging from 80° C. to 160° C. before the developing the selectively exposed photosensitive layer.

13. A method of manufacturing a semiconductor device, comprising:
forming a bottom layer of a trilayer resist over a substrate;
forming a middle layer of a trilayer resist over the bottom layer,
wherein the middle layer comprises a polysiloxane with pendant photoacid generator groups,
wherein the photoacid generator groups are bonded to a silicon in the polysiloxane through an oxygen;
forming a photosensitive layer over the middle layer;
selectively exposing the photosensitive layer and the middle layer to actinic radiation;
diffusing acid released by the pendant photoacid generator groups in exposed portions of the middle layer into exposed portions of the photosensitive layer; and
applying a developer composition to the selectively exposed photosensitive layer to form a pattern in the photosensitive layer,
wherein a monomer of the polysiloxane with the pendant photoacid generator groups is

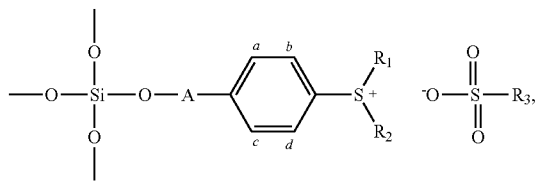

where A is a direct bond, a C1-C5 alkyl group, a C1-C5 cycloalkyl group, a C1-C5 hydroxy alkyl group, a C1-C5 alkoxy group, a C1-C5 alkoxyl alkyl group, a C1-C5 acetyl group, a C1-C5 acetyl alkyl group, a C1-C5 carboxyl group, or a C1-C5 alkyl carboxyl group; R1 and R2 are each independently a C6-C12 aryl group, a C6-C12 alkyl group, a C6-C12 cycloalkyl group, a C6-C12 hydroxy alkyl group, a C6-C12 alkoxy group, a C6-C12 alkoxyl alkyl group, a C6-C12 acetyl group, a C6-C12 acetyl alkyl group, a C6-C12 carboxyl group, a C6-C12 alkyl carboxyl group, a C6-C12 cycloalkyl carboxyl group, a C3-C15 saturated or unsaturated hydrocarbon ring or a C2-C15 heterocyclic group; R3 is a C1-C20 fluorocarbon group, a C6-C20 aryl group, or a C10-C20 adamantyl group; and a, b, c, and d are each independently H or a C1-C6 alkyl group, and R3 includes I.

14. The method according to claim 13, wherein the diffusing acid released by the pendant photoacid generator groups in exposed portions of the middle layer into exposed portions of the photosensitive layer comprises heating the photosensitive layer and the middle layer at a temperature ranging from 80° C. to 160° C. before the applying the developer.

15. The method according to claim 13, wherein the forming the middle layer comprises heating the middle layer at a temperature ranging from 150° C. to 300° C. to polymerize or crosslink the polysiloxane with pendant photoacid generator groups.

16. The method according to claim 15, wherein the photosensitive layer comprises a polymer having pendant acid labile groups and a photoacid generator compound.

17. The method according to claim 16, wherein an anion or a cation of the photoacid generator compound is different from an anion or a cation of the pendant photoacid generator groups.

18. The method of claim 1, wherein at least one of R1 and R2 includes I.

19. The method of claim 8, wherein at least one of R1 and R2 includes I.

20. The method of claim 13, wherein at least one of R1 and R2 includes I.

* * * * *